(12) United States Patent
Harada

(10) Patent No.: US 12,342,608 B2
(45) Date of Patent: Jun. 24, 2025

(54) SEMICONDUCTOR DEVICE

(71) Applicant: FUJI ELECTRIC CO., LTD., Kawasaki (JP)

(72) Inventor: Yuichi Harada, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 140 days.

(21) Appl. No.: 18/298,398

(22) Filed: Apr. 11, 2023

(65) Prior Publication Data
US 2023/0307446 A1  Sep. 28, 2023

Related U.S. Application Data

(63) Continuation of application No. 17/452,069, filed on Oct. 25, 2021, now Pat. No. 11,631,665, and a (Continued)

(30) Foreign Application Priority Data

Nov. 16, 2017 (JP) ................. 2017-221127
Jun. 14, 2018 (JP) ................. 2018-113413

(51) Int. Cl.
H10D 84/60 (2025.01)
H10D 8/00 (2025.01)
(Continued)

(52) U.S. Cl.
CPC .......... *H10D 84/617* (2025.01); *H10D 8/422* (2025.01); *H10D 12/481* (2025.01);
(Continued)

(58) Field of Classification Search
CPC .... H10D 84/617; H10D 8/422; H10D 12/481; H10D 62/111; H10D 62/112;
(Continued)

(56) References Cited

U.S. PATENT DOCUMENTS 10,181,508 B2  1/2019  Tanaka
10,304,951 B2  5/2019  Matsuura
(Continued)

FOREIGN PATENT DOCUMENTS

CN   107180855 A   9/2017
JP   H07135315 A   5/1995
(Continued)

OTHER PUBLICATIONS

International Search Report and (ISA/237) Written Opinion of the International Search Authority for International Patent Application No. PCT/JP2018/034933, mailed by the Japan Patent Office on Dec. 11, 2018.
(Continued)

*Primary Examiner* — Victor A Mandala

(57) ABSTRACT

Provided is a semiconductor device comprising a semiconductor substrate that includes a transistor region; an emitter electrode that is provided on the semiconductor substrate; a first dummy trench portion that is provided on the transistor region of the semiconductor substrate and includes a dummy conducting portion that is electrically connected to the emitter electrode; and a first contact portion that is a partial region of the transistor region, provided between an end portion of a long portion of the first dummy trench portion and an end portion of the semiconductor substrate, and electrically connects the emitter electrode and a semiconductor region with a first conductivity type provided in the transistor region.

19 Claims, 21 Drawing Sheets

Related U.S. Application Data continuation of application No. 16/664,930, filed on Oct. 27, 2019, now Pat. No. 11,158,631, and a continuation of application No. PCT/JP2018/034933, filed on Sep. 20, 2018.

(51) Int. Cl.
  *H10D 12/00* (2025.01)
  *H10D 62/10* (2025.01)
  *H10D 62/13* (2025.01)
  *H10D 62/17* (2025.01)
  *H10D 64/00* (2025.01)

(52) U.S. Cl.
  CPC ......... *H10D 62/111* (2025.01); *H10D 62/112* (2025.01); *H10D 62/127* (2025.01); *H10D 62/142* (2025.01); *H10D 62/393* (2025.01); *H10D 64/112* (2025.01); *H10D 64/117* (2025.01)

(58) Field of Classification Search
  CPC .. H10D 62/127; H10D 62/142; H10D 62/393; H10D 64/112; H10D 64/117; H10D 12/461; H10D 30/60; H10D 62/145; H10D 64/232; H10D 64/519; H10D 84/811
  See application file for complete search history.

(56) References Cited

U.S. PATENT DOCUMENTS

| | | | | |
|---|---|---|---|---|
| 11,094,808 B2* | 8/2021 | Naito | ................... | H10D 62/393 |
| 11,094,810 B2* | 8/2021 | Naito | ..................... | H01L 21/76 |
| 11,430,784 B2* | 8/2022 | Naito | ..................... | H10D 62/60 |
| 2005/0151187 A1 | 7/2005 | Wakimoto | | |
| 2009/0014754 A1 | 1/2009 | Yoshikawa | | |
| 2016/0336404 A1* | 11/2016 | Naito | ................... | H10D 62/393 |
| 2016/0336435 A1* | 11/2016 | Naito | ................... | H10D 62/393 |
| 2017/0018547 A1* | 1/2017 | Naito | ....................... | H10D 8/00 |
| 2017/0018636 A1* | 1/2017 | Naito | ................... | H10D 62/115 |
| 2017/0025522 A1* | 1/2017 | Naito | ................... | H10D 64/513 |
| 2017/0170273 A1* | 6/2017 | Naito | ................... | H10D 64/112 |
| 2017/0236908 A1* | 8/2017 | Naito | ..................... | H10D 62/60 257/48 |
| 2017/0263740 A1* | 9/2017 | Onozawa | ............. | H10D 62/109 |
| 2017/0301779 A1* | 10/2017 | Naito | ................... | H10D 62/127 |
| 2017/0317175 A1* | 11/2017 | Naito | ................... | H10D 64/117 |
| 2018/0069075 A1* | 3/2018 | Naito | ................... | H10D 62/109 |
| 2018/0082996 A1* | 3/2018 | Naito | ................... | H10D 84/135 |
| 2018/0108737 A1* | 4/2018 | Naito | ................... | H10D 62/378 |
| 2018/0108738 A1* | 4/2018 | Naito | ................... | H10D 12/481 |
| 2018/0138299 A1* | 5/2018 | Naito | ................... | H10D 64/519 |
| 2018/0158815 A1* | 6/2018 | Onozawa | ............. | H10D 30/60 |
| 2018/0166279 A1* | 6/2018 | Tamura | ..................... | H10D 8/00 |
| 2018/0182754 A1* | 6/2018 | Naito | ................... | H10D 84/811 |
| 2018/0350961 A1* | 12/2018 | Naito | ................... | H10D 62/107 |
| 2018/0350962 A1* | 12/2018 | Naito | ................... | H01L 21/324 |
| 2018/0366548 A1* | 12/2018 | Naito | ................... | H10D 12/461 |
| 2018/0374948 A1* | 12/2018 | Naito | ................... | H10D 62/393 |
| 2019/0019885 A1* | 1/2019 | Naito | ..................... | H10D 62/81 |
| 2019/0027472 A1* | 1/2019 | Naito | ..................... | H10D 62/81 |
| 2019/0051739 A1* | 2/2019 | Naito | ................... | H10D 12/481 |
| 2019/0074367 A1* | 3/2019 | Naito | ..................... | H10D 12/00 |
| 2019/0252533 A1* | 8/2019 | Naito | ..................... | H10D 8/422 |

FOREIGN PATENT DOCUMENTS

| | | | | |
|---|---|---|---|---|
| JP | 2005175425 A | | 6/2005 | |
| JP | 2009135408 A | | 6/2009 | |
| JP | 2013140885 A | | 7/2013 | |
| JP | 2017168659 A | | 9/2017 | |
| WO | 2017155122 A1 | | 9/2017 | |
| WO | WIPO2017/006711 | * | 12/2017 | ...................... 29/739 |

OTHER PUBLICATIONS

Office Action issued for counterpart Chinese Application 201880028792. X, issued by The State Intellectual Property Office of People's Republic of China on Nov. 30, 2022.

Those references were submitted as IDS or found by the examiner over the earlier U.S. Appl. No. 16/664,930, filed Oct. 27, 2019.

Those references were submitted as IDS or found by the examiner over the earlier U.S. Appl. No. 17/452,069, filed Oct. 25, 2021.

\* cited by examiner

SEMICONDUCTOR DEVICE

CROSS-REFERENCE TO RELATED APPLICATIONS

This application is a continuation application of U.S. patent application Ser. No. 17/452,069, filed on Oct. 25, 2021, which is a continuation application of U.S. patent application Ser. No. 16/664,930, filed on Oct. 27, 2019, which is a continuation of International Application No. PCT/JP2018/034933, filed on Sep. 20, 2018, which claims priority to Japanese Patent Application No. 2017-221127 filed in JP on Nov. 16, 2017, and No. 2018-113413 filed in JP on Jun. 14, 2018, the contents of each of which are hereby incorporated herein by reference in their entirety.

BACKGROUND

1. Technical Field

The present invention relates to a semiconductor device.

2. Related Art

A conventional semiconductor device is known in which an emitter runner is provided such that current flows in a horizontal direction inside a floating p type region and reaches an emitter electrode, as shown in Patent Document 1, for example. Furthermore, a technique is known for adjusting the number of p type base regions electrically connected to the emitter electrode and adjusting the number of p type base regions isolated from the emitter electrode, in order to keep the turn-ON loss and radiated noise values within the specifications, as shown in Patent Document 2, for example.

Patent Document 1: Japanese Patent Application Publication No. 2009-135408
Patent Document 2: Japanese Patent Application Publication No. 2005-175425

In a semiconductor device that includes a dummy trench having a dummy conducting portion electrically connected to the emitter electrode, there are cases where the contact portion between the emitter electrode and the dummy conducting portion is provided near an end portion of an active region. In a case where the contact portion is provided in this manner, the carriers (e.g. holes) that remain in the region within the semiconductor substrate between the contact portion and the end portion of the main surface of the substrate are preferably extracted to the emitter electrode.

SUMMARY

According to a first aspect of the present invention, provided is a semiconductor device. The semiconductor device may comprise a semiconductor substrate, an emitter electrode, a first dummy trench portion, and a first contact portion. The semiconductor substrate may include a transistor region. The emitter electrode may be provided on the semiconductor substrate. The first dummy trench portion may be provided on the transistor region of the semiconductor substrate. The first dummy trench portion may include a dummy conducting portion. The dummy conducting portion may be electrically connected to the emitter electrode. At the first contact portion, the emitter electrode and a semiconductor region with a first conductivity type provided in the transistor region may be electrically connected. The first contact portion may be provided at a partial region of the transistor region between an end portion of a long portion of the first dummy trench portion and an end portion of the semiconductor substrate.

A second direction may be orthogonal to a first direction in which the long portion extends. A width of the first contact portion in the second direction may be greater than a width of the first dummy trench portion in the second direction.

The transistor region may include a mesa portion. The mesa portion may be a portion of the semiconductor substrate positioned between two adjacent first dummy trench portions. A width of the first contact portion in the second direction orthogonal to the first direction in which the long portion extends is greater than a width of the mesa portion in the second direction.

The first dummy trench portion may include a long portion and a short portion. The long portion may extend in the first direction. The short portion may extend in the second direction that is orthogonal to the first direction. The short portion may connect to the long portion at a first-direction end portion of the long portion. A width of the first contact portion in the second direction may be greater than a width of the short portion of the first dummy trench portion in the second direction.

The semiconductor device may further comprise a connection layer. The connection layer may be provided in the transistor region. The connection layer may be electrically connected to at least the dummy conducting portion of the short portion. The connection layer may be a polysilicon layer. The width of the first contact portion in the second direction may be greater than a width of the connection layer in the second direction.

The first contact portion may include a main region and a sub region. The main region may extend in a direction parallel to the second direction that is orthogonal to the first direction. The first direction may be the direction in which the long portion of the first dummy trench portion extends. The sub region may be connected to the main region. The sub region may extend in a direction from the main region toward the first dummy trench portion.

The first contact portion may include one of the main regions and two of the sub regions. The two sub regions may include a first sub region and a second sub region. The first sub region may be connected to a first end portion that is on the second-direction side of the main region. The first sub region may extend toward the first dummy trench portion. The second end portion may be different from the first end portion. The second sub region may be connected to a second end portion on the second-direction side of the main region. The second sub region may extend toward the first dummy trench portion.

The semiconductor substrate may include a diode region. The diode region may be adjacent to the transistor region. The semiconductor device may further comprise a second dummy trench portion and a second contact portion. The second dummy trench portion may be provided in the diode region. The second dummy trench portion may include a dummy conducting portion. The dummy conducting portion may be electrically connected to the emitter electrode. The second contact portion may be a partial region of the diode region provided between an end portion of a long portion of the second dummy trench portion and an end portion of the semiconductor substrate. At the second contact portion, the emitter electrode and a semiconductor region with a first conductivity type provided in the diode region may be electrically connected. A width of the second contact portion in the second direction that is orthogonal to the first direction in which the long portion extends may be greater than a width of the first contact portion in the second direction.

The diode region may include a mesa portion. The mesa portion may be a portion of the semiconductor substrate positioned between two adjacent first dummy trench portions. The second contact portion may extend in the second direction. The second contact portion may be provided spanning a length corresponding to a plurality of the mesa portions in the diode region.

The transistor region may include a charge accumulation region with a second conductivity type. The charge accumulation region may be provided between a floor portion of the first dummy trench portion and a floor portion of a base region that is a portion of a semiconductor region with the first conductivity type in a depth direction of the semiconductor substrate. The charge accumulation region may be provided farther inward than the first contact portion in a planar direction that is orthogonal to the depth direction.

The semiconductor device may comprise a plurality of the transistor regions and the diode region. The plurality of the transistor regions may be provided distanced from each other in the second direction. The diode region may be provided between two of the transistor regions that are adjacent to each other in the second direction, among the plurality of transistor regions.

The semiconductor device may further comprise a gate runner portion, as well as a gate trench portion and one or more peripheral longitudinal contact portions that are each positioned in the transistor region. The gate runner portion may be positioned outward from an active region in which the transistor region is provided. The gate trench portion may extend in a first direction in which the long portion extends. The gate trench portion may include a gate conducting portion. The gate conducting portion may be electrically connected to the gate runner portion. The one or more peripheral longitudinal contact portions may be positioned farther outward than the gate trench portion or the first dummy trench portion positioned farthest outward in a second direction orthogonal to the first direction. The one or more peripheral longitudinal contact portions may extend in the first direction. A separation distance between the gate runner portion and a peripheral longitudinal contact portion that is closest to the end portion of the semiconductor substrate in the second direction, among the one or more peripheral longitudinal contact portions, may be equal to a separation distance between the first contact portion and the gate runner portion.

The semiconductor substrate in the transistor region may include a base region with the first conductivity type. The semiconductor region connected to the emitter electrode by the first contact portion may be a high concentration region with a higher doping concentration than the base region. The semiconductor device may comprise a gate metal layer that is positioned outside of an active region in which the transistor region is provided. The high concentration region may be provided in a manner to be continuous from below the first contact portion to below the gate metal layer.

The semiconductor device may include a plurality of gate trench portions that are provided in the transistor region and extend in a first direction in which the long portion of the dummy trench portion extends. Each gate trench portion may be provided extending from the transistor region to below the gate metal layer. The high concentration region may be provided extending from below the first contact portion to below the gate metal layer, between two of the gate trench portions.

At least one of the gate trench portions may have its end portion in the first direction arranged below the gate metal layer. The high concentration region may extend farther outward than the end portion in the first direction of the gate trench portion.

The high concentration regions may be provided respectively for a plurality of the first contact portions. The high concentration regions may be connected to each other farther outward than the end portions of the gate trench portions in the first direction.

The semiconductor device may comprise a gate connection portion that is made of polysilicon, is provided between the gate metal layer and the end portion of the gate trench portion, and electrically connects the gate metal layer and the gate trench portion. The high concentration region may be arranged in a region that does not overlap with the gate connection portion.

A plurality of the gate connection portions may be arranged distanced from each other below the gate metal layer. The high concentration region may extend farther outward than the end portions of the gate trench portions, between two gate connection portions.

At least some of the gate trench portions may be shaped to be linear in an overhead view and may have end portions arranged below the gate metal layer. The high concentration region may extend farther outward than the linear end portions, between two of the linear end portions.

At least some of the gate trench portions may include two long portions that extend in a first direction and a short portion that is provided below the gate metal layer and connects two of the long portions. The high concentration region may extend farther outward than the short portions, between two of the short portions.

The semiconductor substrate may include a diode region adjacent to the transistor region. The semiconductor device may include a second dummy trench portion that is provided in the diode region and has a dummy conducting portion electrically connected to the emitter electrode. The semiconductor device may include a second contact portion that is provided between an end portion of a long portion of the second dummy trench portion and an end portion of the semiconductor substrate. The high concentration region may be provided from below the second contact portion to below the gate metal layer. A width of the high concentration region in the diode region may be greater than a width of the high concentration region in the transistor region, in the second direction that is orthogonal to the first direction.

The high concentration region may be provided extending farther outward than the gate metal layer in a first direction in which the long portion extends. The semiconductor device may comprise one or more peripheral longitudinal contact portions that are positioned farther outward than the first dummy trench portion or gate trench portion that is positioned farthest outward in a second direction orthogonal to the first direction, and extend in the first direction. The high concentration region may also be provided in the one or more peripheral longitudinal contact portions. The high concentration region may be provided extending in the second direction from below the peripheral longitudinal contact portion to below the gate metal layer.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
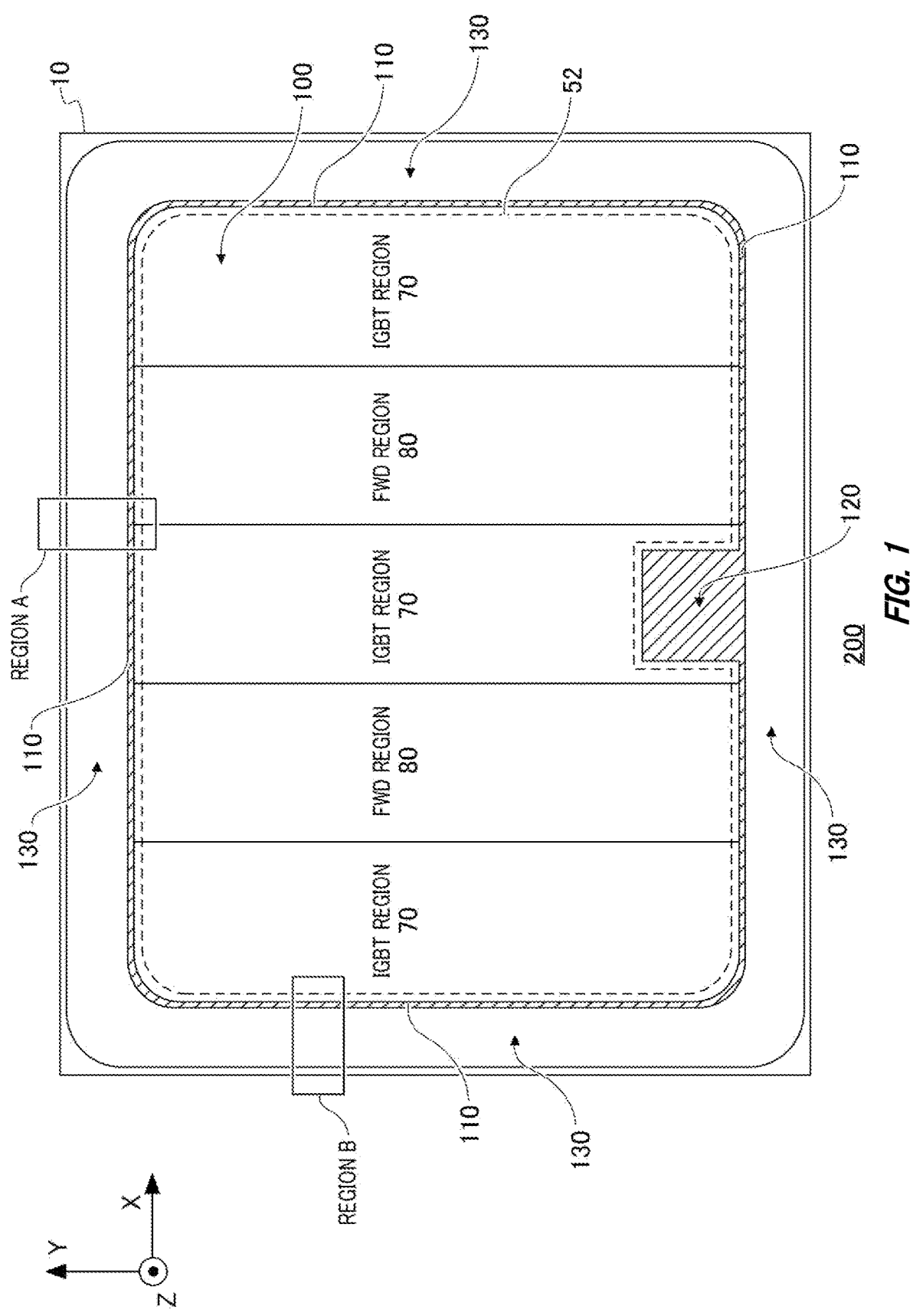
FIG. 1 is a schematic view of a top surface of a semiconductor device 200.

FIG. 1 is a schematic view of a top surface of a semiconductor device 200. The semiconductor device 200 of the present example includes a semiconductor substrate 10. The semiconductor substrate 10 may have a schematically rectangular shape in an overhead view. The semiconductor substrate 10 of the present example has a top surface that is parallel to an X-Y plane at an end portion in a positive Z-axis direction, and a bottom surface that is parallel to the X-Y plane at an end portion in the negative Z-axis direction. In the present example, the top surface is the main surface of the semiconductor substrate 10 in the positive Z-axis direction, and the bottom surface is the main surface of the semiconductor substrate 10 in the negative Z-axis direction.

In the present example, the X-axis and the Y-axis are orthogonal to each other, and the Z-axis is orthogonal to the X-Y plane. The X-axis, the Y-axis, and the Z-axis form a so-called right-handed system. In the present example, the Y-axis direction is an example of a first direction, and the X-axis direction is an example of a second direction. In this Specification, there are cases where a direction parallel to the Z-axis is referred to as the depth direction of the semiconductor substrate 10. In this Specification, the terms "up" and "down" are not limited to the up and down directions in the direction of gravity. These terms merely refer to directions relative to the Z-axis.

The semiconductor device 200 of the present example includes an active region 100, a gate runner portion 110, a gate pad region 120, and an edge termination region 130. The active region 100 may be provided inside the gate runner portion 110. In the present example, the inside of the gate runner portion 110 and the gate pad region 120 is the active region 100. The active region 100 may correspond to a range in the X-Y plane where the emitter electrode 52 is provided. In FIG. 1, the range in the X-Y plane where the emitter electrode 52 is provided on the semiconductor substrate 10 is shown by dashed lines.

The active region 100 of the present example includes a plurality of IGBT (Insulated Gate Bipolar Transistor) regions 70 and a plurality of FWD (Free Wheeling Diode) regions 80. The semiconductor device 200 of the present example is an RC-IGBT (Reverse Conducting—IGBT) that has the IGBT regions 70 and the FWD regions 80 provided on one semiconductor substrate 10. The IGBT regions 70 are examples of transistor regions, and the FWD regions 80 are examples of diode regions.

The plurality of IGBT regions 70 may be provided distanced from each other in the X-axis direction in the active region 100. In the present example, three IGBT regions 70 are provided. An IGBT region 70, and not a FWD region 80, may be provided at each end portion of the active region 100 in the X-axis direction. One FWD region 80 may be provided between each set of two IGBT regions 70 that are adjacent in the X-axis direction. Therefore, the number of FWD regions 80 is less than the number of IGBT regions 70 in the active region 100. The active region 100 of the present example includes a total of two FWD regions 80. The number of IGBT regions 70 and FWD regions 80 is an example, and a number of IGBT regions 70 and FWD regions 80 greater than the number in the present example may be provided.

The gate runner portion 110 and the gate pad region 120 of the present example cover the outer periphery of the active region 100. The gate runner portion 110 of the present example has a rectangular shape with rounded corners. The gate runner portion 110 may include a polysilicon conducting portion that is embedded in a trench, a polysilicon layer positioned on the conducting portion, and a metal layer positioned on the polysilicon layer. The gate runner portion 110 may include just the polysilicon layer and the metal layer within a prescribed range of the semiconductor substrate 10. The gate runner portion 110 may be electrically connected to the gate pad region 120.

The gate runner portion 110 may have a function to transfer a control signal (e.g. a gate potential), which has been transferred from the gate pad region 120, to the IGBT regions 70. A wire may be electrically connected to the gate pad region 120, by bonding or the like. The control signal may be input to the gate pad region 120 from an external terminal via the wire.

The edge termination region 130 may be provided in a manner to surround the active region 100 and the gate runner portion 110. The edge termination region 130 of the present example is provided in a manner to surround the gate runner portion 110 at the outer periphery of the gate runner portion 110. The edge termination region 130 may have a function to relax the electric field concentration at the top surface side of the semiconductor substrate 10. The edge termination region 130 has a guard ring, a field plate, a RESURF, and a structure formed by a combination thereof, for example.

Figure 2:
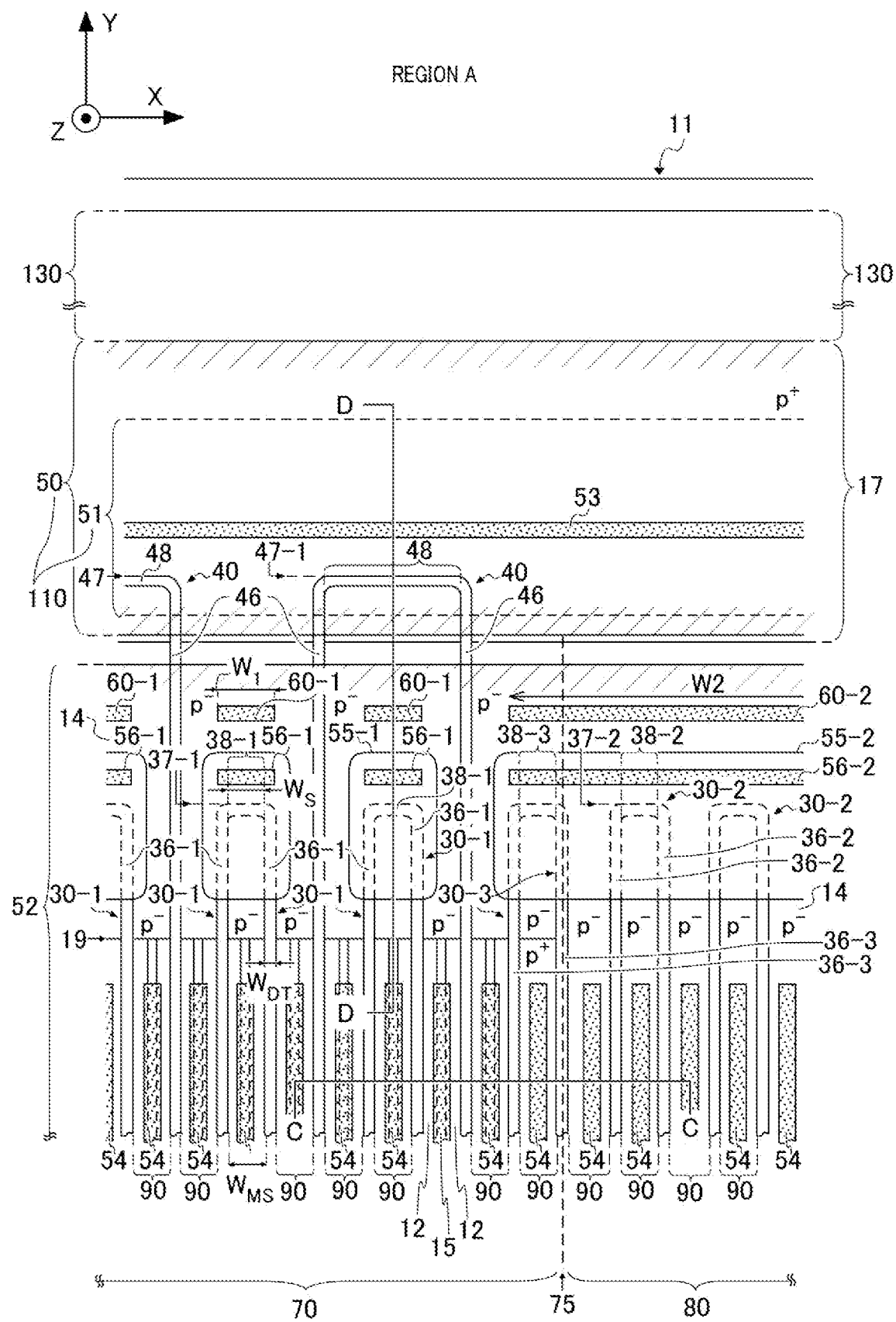
FIG. 2 shows the region A of FIG. 1 according to a first embodiment.

FIG. 2 shows the region A of FIG. 1 according to a first embodiment. The region A includes a border 75 between an IGBT region 70 and a FWD region 80 and a portion of the gate runner portion 110 adjacent to the active region 100. In the present example, the border 75 between the IGBT region 70 and the FWD region 80 is a plane that is parallel to the Y-Z plane and passes through a dummy trench portion 30-3 of the IGBT region 70.

The semiconductor substrate 10 of the present example includes a plurality of dummy trench portions 30-1 and a plurality of gate trench portions 40 in the IGBT region 70. The dummy trench portions 30-1 are examples of first dummy trench portions. In the region A, the dummy trench portions 30-1 and the gate trench portions 40 each have an upside-down U shape.

Each dummy trench portion 30-1 of the present example includes two long portions 36-1 that each extend in the Y-axis direction and one short portion 38-1 that extends in the X-axis direction. The short portion 38-1 of the present example connects to a long portion 36-1 at an end portion 37-1 of the long portion 36-1 in the Y-axis direction. An end of the short portion 38-1 of the present example in the Y-axis direction is at the same position as the end portion 37-1 in the Y-axis direction. Similarly, each gate trench portion 40 of the present example includes two long portions 46 that each extend in the Y-axis direction and one short portion 48 that extends in the X-axis direction. This short portion 48 of the present example also connects to a long portion 46 at an end portion 47 of the long portion 46 in the positive Y-axis direction.

In the present example, one gate trench portion 40 is provided outside one dummy trench portion 30-1. In the present example, one gate trench portion 40 is provided to surround one dummy trench portion 30-1. In the present embodiment, the end portion 47 of the gate trench portion 40 is positioned farther outward than the end portion 37-1 of the dummy trench portion 30-1. Furthermore, the length of the short portion 48 of the gate trench portion 40 in the X-axis direction is greater than the length of the short portion 38-1 of the dummy trench portion 30-1 in the X-axis direction.

In the present embodiment, the short portion 38-1 is a part that is parallel to the X-axis direction at the end portion 37-1 of the dummy trench portion 30-1. In the present example, the length of the short portion 38-1 in the X-axis direction (i.e. the width thereof in the X-axis direction) is $W_S$. However, in another example, the short portion 38-1 may be a part of the dummy trench portion 30-1 other than the linear portion of the long portion 36-1 and the curved portion near the end portion 37-1 of the long portion 36-1. Similarly, in the present example, the short portion 48 is a part that is parallel to the X-axis direction at the end portion 47 of the gate trench portion 40. However, in another example, the short portion 48 may be a part of the gate trench portion 40 other than the linear portion of the long portion 46 and the curved portion near the end portion 47 of the long portion 46.

In the present example, a gate trench portion 40 surrounding a dummy trench portion 30-1 in the X-Y plane and a dummy trench portion 30-1 that is not surrounded by a gate trench portion 40 are provided in an alternating manner in the X-axis direction. Any method may be used to determine the repeating unit, and as an example, the repeating unit is a set of one long portion 46 of a gate trench portion 40 and two long portions 36-1 of a dummy trench portion 30-1. The border 75 is positioned at a long portion 36-3 of a dummy trench portion 30-3 that is not surrounded by a gate trench portion 40, in the IGBT region 70.

In the IGBT region 70 of the present example, the distance in the X-axis direction between a long portion 46 and a long portion 36-1, the distance in the X-axis direction between a long portion 46 and a long portion 36-3, the distance in the X-axis direction between long portions 36-1, and the distance in the X-axis direction between long portions 36-3 are all equal. In the present example, each portion of the semiconductor substrate 10 sandwiched in the X-axis direction between two long portions (e.g. between long portions 46 and 36-1, between long portions 46 and 36-3, between two long portions 36-1, and between two long portions 36-3) is referred to as a mesa portion 90.

Each mesa portion 90 of the IGBT region 70 includes an n⁺ type emitter region 12, a p type base region 14, and a p⁺ type contact region 15. However, each mesa portion 90 sandwiched between two long portions 36-3 differs by not including an emitter region 12. It should be noted that, in the present example, mesa portions 90 other than the mesa portions 90 sandwiched between two long portions 36-3 each include an emitter region 12 and a contact region 15. By providing the contact region 15, it is possible to extract holes through a mesa contact portion 54 positioned on the mesa portion 90.

In the present example, p type is an example of a first conductivity type and n type is an example of a second conductivity type. However, in another example, n type may be the first conductivity type and p type may be the second conductivity type. Furthermore, in the present example, n and p respectively indicate that electrons and holes are the majority carrier. Yet further, concerning "+" or "−" appended to n or p, "+" indicates that the carrier concentration is higher than in a case where "+" is not included, and "−" indicates that the carrier concentration is lower than in a case where "−" is not included.

Each of the emitter region 12, the base region 14, and the contact region 15 has at least a portion thereof exposed at the top surface of the semiconductor substrate 10, and is provided to a prescribed depth from the top surface of the semiconductor substrate 10. In the present example, the emitter region 12 and the contact region 15 are provided extending in the Y-axis direction. In the present example, the emitter region 12 contacts each trench portion in the X-axis direction. Each contact region 15 is exposed at the top surface between two emitter regions 12. In this Specification, there are cases where the dummy trench portions 30 and the gate trench portions 40 are referred to collectively as trench portions.

In the present example, a mesa contact portion 54 extending in the Y-axis direction is provided on each mesa portion 90. The mesa contact portion 54 of the present example is an open portion in which an interlayer insulating film is provided. The emitter electrode 52 may be provided within the mesa contact portion 54, and may be electrically connected to the contact region 15 and the emitter region 12 through the mesa contact portion 54. A metal plug made of tungsten (W) or the like may be provided in the mesa contact portion 54. The emitter electrode 52 may be electrically connected to the contact region 15 and the emitter region 12 through this metal plug.

In the present example, the termination portion 19 of the emitter region 12 and the contact region 15 is positioned farther in the negative Y-axis direction (i.e. farther inward) than the short portion 38-1 of the dummy trench portion 30-1. The termination portion 19 of the present example is positioned farther in the negative Y-axis direction than the negative Y-axis direction end portion of a connection layer 55-1 shaped as an island. The emitter region 12 and the contact region 15 may extend continuously in the Y-axis direction, farther in the negative Y-axis direction than the termination portion 19.

The connection layer 55-1 may be electrically connected to at least the dummy conducting portion of the short portion 38-1 of the dummy trench portion 30-1. The connection layer 55-1 may be a polysilicon layer. The connection layer 55-1 may be formed of the same material as the dummy conducting portion of the dummy trench portion 30-1. In the present example, the connection layer 55-1 and the dummy conducting portion of the dummy trench portion 30-1 are both formed of polysilicon.

The connection layer 55-1 and the top surface of the semiconductor substrate 10 may be electrically insulated from each other by an insulation film such as an oxide film provided therebetween. However, the insulation film such as the oxide film does not need to be provided in the region where the connection layer 55-1 overlaps with the dummy conducting portion of the dummy trench portion 30-1. In the region where the connection layer 55-1 overlaps with the dummy conducting portion of the dummy trench portion 30-1, the connection layer 55-1 and the dummy conducting portion may be formed continuously of polysilicon material. For example, a polysilicon layer is blanket deposited in a manner to fill the trench of the dummy trench portion 30-1 and cover the top surface of the semiconductor substrate 10, and then this polysilicon layer is patterned.

An interlayer insulating film may be provided on the connection layer 55-1. The connection layer 55-1 may be electrically connected to the emitter electrode 52 at a connection layer contact portion 56-1 provided on the interlayer insulating film. In this way, the dummy conducting portion of the dummy trench portion 30-1 can be electrically connected to the emitter electrode 52 via the connection layer 55-1.

In the present example, mainly the p type base region 14 and a p$^+$ type well region 17 are exposed at the top surface of the semiconductor substrate 10, farther in the Y-axis direction than the termination portion 19. Furthermore, the p$^+$ type contact region 15 is exposed at the top surface of the semiconductor substrate 10 directly below a peripheral contact portion 60-1, farther in the Y-axis direction than the termination portion 19. In contrast to this, the base region 14 may be provided on the entire top surface of the semiconductor substrate 10. Therefore, in a region where the n$^+$ type emitter region 12 or p$^+$ type contact region 15 and the well region 17 are not provided, the base region 14 is exposed at the top surface.

The semiconductor device 200 of the present example include the peripheral contact portion 60-1 provided in the IGBT region 70. The peripheral contact portion 60-1 is an example of a first contact portion. The peripheral contact portion 60-1 may be provided in a partial region between the end portion 37-1 of the long portion 36-1 of the dummy trench portion 30-1 and the end portion 11 of the semiconductor substrate 10. The peripheral contact portion 60-1 of the present example is provided between the positive Y-axis direction end portion of the connection layer 55-1 and the positive Y-axis direction end portion of the emitter electrode 52, in the X-Y plane direction. For example, the negative Y-axis direction end portion of the peripheral contact portion 60-1 is distanced several micrometers from the positive Y-axis direction end portion of the connection layer 55-1, and the positive Y-axis direction end portion of the peripheral contact portion 60-1 is distanced several micrometers from the Y-axis direction end portion of the emitter electrode 52.

The p$^+$ type contact region 15 may be provided directly below the peripheral contact portion 60-1. The range in the X-Y plane direction of the peripheral contact portion 60-1 may be equal to the range in the X-Y plane direction of the contact region 15 directly below the peripheral contact portion 60-1. In the present example, the peripheral contact portion 60-1 has a rectangular shape in the X-Y plane, with the edges in the X-axis direction being longer than the edges in the Y-axis direction. As shown in the drawings described further below, the range in the X-Y plane direction of the peripheral contact portion 60-1 of the present example is less than the range in the X-Y plane direction of the contact region 15 directly below the peripheral contact portion 60-1 and is also contained within the range in the X-Y plane direction of the contact region 15.

In the peripheral contact portion 60-1 of the present example, the emitter electrode 52 is electrically connected to the p$^+$ type contact region 15 provided in a portion of the IGBT region 70 positioned farther outward than the connection layer 55-1. Concerning the contact region 15 directly below the peripheral contact portion 60-1, please reference the D-D cross section. In the present example, within the semiconductor substrate 10, the carriers (e.g. holes) remaining in the outer peripheral region can be extracted to the emitter electrode 52 through the peripheral contact portion 60-1.

The IGBT region 70 includes a p$^+$ type collector region that supplies holes to the drift region, on the bottom surface side of the semiconductor substrate 10. The collector region may be provided in a wider range than the IGBT region 70. The collector region is provided below the gate runner portion 110, for example. However, when the IGBT is ON, holes are also injected from the collector region into the drift region in the outer peripheral region of the semiconductor substrate 10 positioned outside the active region 100 in the X-Y plane direction.

The holes injected into the drift region from nearby the collector region positioned below the region farther in the positive Y-axis direction than the termination portion 19 (e.g. the end portion of the emitter electrode 52 in the positive Y-axis direction) can be extracted from the mesa contact portion 54 to the emitter electrode 52 when the IGBT is OFF. However, in a case where the peripheral contact portion 60-1 of the present example is not provided, it is possible for the holes injected from the collector region in the outer peripheral region of the semiconductor substrate 10 to remain within the semiconductor substrate 10 without being extracted to the emitter electrode 52. When holes are accumulated every time the IGBT is turned ON, the potential difference within the semiconductor substrate 10 increases and localized electric field concentration can occur. As a result, there are cases where the semiconductor device 200 partially breaks down. In the present example, the carriers remaining in the outer peripheral region are extracted to the emitter electrode 52 through the peripheral contact portion 60-1, and therefore it is possible to restrict the electric field concentration and partial breakdown, compared to a case where the peripheral contact portion 60-1 is not provided. By providing the peripheral contact portion 60-1, the charge imbalance in the semiconductor substrate 10 is eliminated, and therefore it is possible to obtain the semiconductor device 200 having high breakdown resistance and high reliability.

The width $W_1$ of the peripheral contact portion 60-1 in the X-axis direction may be greater than the width $W_{DT}$ of the dummy trench portion 30-1 in the X-axis direction. In the present example, the width $W_1$ in the X-axis direction is the maximum width in the X-axis direction of an opening of the interlayer insulating film provided at a position corresponding to the peripheral contact portion 60-1. Furthermore, in the present example, the width $W_{DT}$ is the maximum width in the X-axis direction of a grooved portion (i.e. the trench)

in the dummy trench portion 30-1. The greater the width $W_1$ of the peripheral contact portion 60-1, the greater the surface area of the peripheral contact portion 60-1, and therefore a greater width has a benefit of making it easier to extract the carriers remaining in the outer peripheral region.

Furthermore, the width $W_1$ of the peripheral contact portion 60-1 in the X-axis direction may be greater than the width $W_{MS}$ of the mesa portion 90 in the X-axis direction. In the present example, the width $W_{MS}$ is the minimum distance in the X-axis direction between two grooved portions (i.e. trenches) that are adjacent in the X-axis direction. In the present example, the width $W_{MS}$ is greater than the width $W_{DT}$. The greater the surface area of the peripheral contact portion 60-1, the easier it is to extract the carriers remaining in the outer peripheral region, and therefore a greater surface area is beneficial. Furthermore, the width $W_1$ of the peripheral contact portion 60-1 in the X-axis direction may be greater than the width $W_S$ of the short portion 38-1 of the dummy trench portion 30-1 in the X-axis direction. In the present example, the width $W_S$ of the short portion 38-1 is equal to the width $W_{MS}$ of the mesa portion 90.

The dummy trench portion 30-3 that includes a long portion 36-3 positioned at the border 75 may partially overlap with the connection layer 55-2 provided mainly in the FWD region 80. In the dummy trench portion 30-3 of the present example, part of the long portion 36-3 and the entirety of the short portion 38-3 overlap with the connection layer 55-2. In the region where the connection layer 55-2 overlaps with the dummy conducting portion of the dummy trench portion 30-3, the connection layer 55-2 and the dummy conducting portion of the dummy trench portion 30-3 may be formed continuously by polysilicon material. The connection layer 55-2 itself may be a polysilicon layer.

In the present example as well, the connection layer 55-2 may be electrically connected to the emitter electrode 52, in the connection layer contact portion 56-2 provided in the interlayer insulating film. Furthermore, the $p^+$ type contact region 15 may be electrically connected to the emitter electrode 52 in the peripheral contact portion 60-2 provided at the same position in the Y-axis direction as the peripheral contact portion 60-1. The peripheral contact portions 60-1 and 60-2 may have the same prescribed length in the Y-axis direction.

The gate trench portion 40 of the IGBT region 70 may extend past the active region 100 to reach the gate runner portion 110 positioned outside the active region 100. The gate runner portion 110 of the present example is a multi-layer structure including a gate metal layer 50 and a gate runner 51 that is a polysilicon layer. An interlayer insulating film is provided between the gate metal layer 50 and the gate runner 51. It should be noted that the gate metal layer 50 and the gate runner 51 are not electrically connected to each other in the runner contact portion 53 where the interlayer insulating film is provided.

Part of the long portion 46 and the entirety of the short portion 48 in the gate trench portion 40 may be positioned below one or both of the gate metal layer 50 and the gate runner 51. The gate trench portion 40 of the present example includes a gate conducting portion that is electrically connected to the gate runner portion 110. The gate runner 51 of the present example may be formed of the same material as the gate conducting portion of the gate trench portion 40. In the present example, the gate runner 51 and the gate conducting portion are both formed of polysilicon. For example, a polysilicon layer is blanket deposited in a manner to fill the trench of the gate trench portion 40 and cover the top surface of the semiconductor substrate 10, and then this polysilicon layer is patterned.

The gate runner 51 and the top surface of the semiconductor substrate 10 may be electrically insulated from each other by an insulating film such as an oxide film provided therebetween. However, in the region where the gate runner 51 and the gate conducting portion overlap with each other, the insulating film such as the oxide film is not provided. In the region where the gate runner 51 and the gate conducting portion overlap with each other, the gate runner 51 and the gate conducting portion may be formed continuously of polysilicon material.

The semiconductor substrate 10 of the present example includes the $p^+$ type well region 17 within a range from a position directly below the positive Y-axis direction end portion of the gate metal layer 50 and a position farther inward than a position directly below the negative Y-axis direction end portion of the gate metal layer 50. The well region 17 may be provided from the top surface of the semiconductor substrate 10 to a position that has a maximum depth, in the depth direction, that is deeper than a floor portion of the gate trench portion 40. The well region 17 may cover at least the floor portion of the short portion 48 from below. The well region 17 of the present example may cover, from below, the floor portion of the short portion 48 and the floor portion of part of the long portion 46 positioned near the short portion 48. In the manner shown in the region A, the gate metal layer 50 and the emitter electrode 52 are electrically separated by being distanced from each other.

The emitter electrode 52 and the gate metal layer 50 are formed of a material including metal. For example, at least a partial region of each electrode is formed of aluminum (Al), an aluminum (Al)-silicon (Si) alloy, or an aluminum (Al)-silicon (Si)-copper (Cu) alloy. Each electrode may include a barrier metal formed of titanium, a titanium compound, or the like in the bottom layer of the region formed by aluminum or the like. Furthermore, the plug described above may be provided between the emitter electrode 52 and the top surface of the semiconductor substrate 10.

The FWD region 80 includes a dummy trench portion 30-2 that has the same shape as the dummy trench portions 30-1 and 30-3. The dummy trench portion 30-2 is an example of a second dummy trench portion. Each mesa portion 90 between a long portion 36-3 of a dummy trench portion 30-3 and a long portion 36-2 of a dummy trench portion 30-2 and each mesa portion 90 between two long portions 36-2 is provided with the base region 14, but not provided with the emitter region 12 and the contact region 15.

The dummy trench portion 30-2 of the present example also includes a dummy conducting portion, in the same manner as the dummy trench portions 30-1 and 30-3. By continuously forming this dummy conducting portion and the connection layer 55-2 of polysilicon material, the dummy conducting portion and the emitter electrode 52 are electrically connected to each other.

The semiconductor device 200 of the present example includes a peripheral contact portion 60-2 provided in the FWD region 80. The peripheral contact portion 60-2 is an example of a second contact portion. The peripheral contact portion 60-2 may be provided in the region between the end portion 37-2 of the long portion 36-2 of the dummy trench portion 30-2 and the end portion 11 of the semiconductor substrate 10. The peripheral contact portion 60-2 of the present example is provided between the positive Y-axis direction end portion of the connection layer 55-2 and the positive Y-axis direction end portion of the emitter electrode 52. In the present example, the length of the peripheral contact portion 60-2 in the Y-axis direction is the same as that of the peripheral contact portion 60-1.

A p$^+$ type contact region 15 may be provided directly below the peripheral contact portion 60-2. In the present example, the range in the direction of the X-Y plane of the peripheral contact portion 60-2 is equal to the range in the direction of the X-Y plane of the contact region 15 directly below the peripheral contact portion 60-2. However, the contact region 15 provided corresponding to the peripheral contact portion 60-2 is sufficiently longer than the contact region 15 provided corresponding to the peripheral contact portion 60-1.

In the peripheral contact portion 60-2 as well, the emitter electrode 52 and the p$^+$ type contact region 15 provided in the IGBT region 70 are electrically connected to each other. The width $W_2$ of the peripheral contact portion 60-2 in the X-axis direction may be greater than the width $W_1$ of the peripheral contact portion 60-1 in the X-axis direction. The peripheral contact portion 60-2 of the present example is provided extending in the X-axis direction across a length corresponding to the plurality of mesa portions 90 in the FWD region 80.

In particular, the peripheral contact portion 60-2 of the present example is provided spanning from the negative X-axis direction end portion of the mesa portion 90 adjacent to the border 75 in the IGBT region 70 across all the mesa portions 90 of the FWD region 80. In the present example, the holes flowing around and into the FWD region 80 from the outer peripheral region of the IGBT region 70 can be extracted to the emitter electrode 52 through the peripheral contact portion 60-2. Accordingly, compared to a case where the peripheral contact portion 60-2 is not provided, the number of holes remaining in the semiconductor substrate 10 can be more reliably decreased.

In the present example, the connection layer 55-2 and the connection layer contact portion 56-2 are provided along the X-axis direction from a portion of the IGBT region 70 and then beyond the border 75 and across the entire FWD region 80. The length of the connection layer 55-2 in the X-axis direction is greater than the length of the connection layer contact portion 56-2 in the X-axis direction. The length of the connection layer contact portion 56-2 in the X-axis direction is the same as the length of the peripheral contact portion 60-2 in the X-axis direction.

Figure 3:
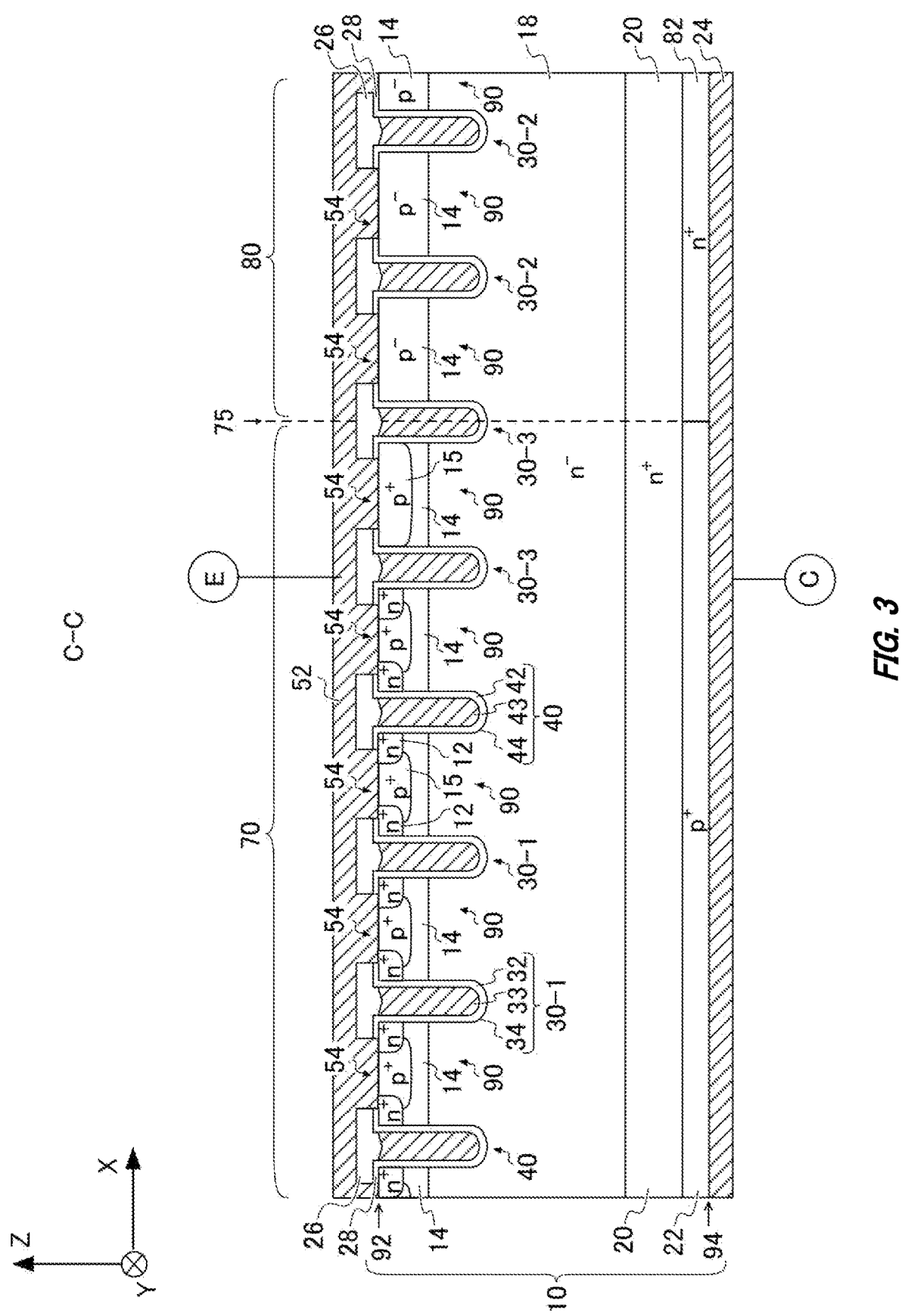
FIG. 3 shows the C-C cross section of FIG. 2.

FIG. 3 shows the C-C cross section of FIG. 2. The C-C cross section is parallel to the X-Z plane and spans an IGBT region 70 and a FWD region 80. The C-C cross section passes through the emitter regions 12 and the contact regions 15 of the mesa portions 90 in the IGBT region 70. In the C-C cross section, the semiconductor substrate 10, an oxide film 28, an interlayer insulating film 26, the emitter electrode 52, and the collector electrode 24 are shown. The oxide film 28 and the interlayer insulating film 26 of the present example are each provided on the top surface 92 of the semiconductor substrate 10. The oxide film 28 may be a silicon dioxide (SiO$_2$) film. The interlayer insulating film 26 may be formed of one or more types of material including BPSG (Boro-Phospho Silicate Glass), PSG (Phosphorus Silicate Glass), and BSG (Borosilicate Glass).

The emitter electrode 52 of the present example contacts the top surface 92 and the interlayer insulating film 26, and is provided across the IGBT region 70 and the FWD region 80. The collector electrode 24 contacts the semiconductor substrate 10 and the bottom surface 94, and is provided across the entire bottom surface 94. The material of the emitter electrode 52 and the collector electrode 24 may be aluminum (Al), an aluminum (Al)-silicon (Si) alloy, an aluminum (Al)-silicon (Si)-copper (Cu) alloy, or an aluminum (Al)-nickel (Ni) alloy.

The semiconductor substrate 10 of the present example includes gate trench portions 40, dummy trench portions 30-1, 30-2, and 30-3, the n$^+$ type emitter region 12, the p$^+$ type contact region 15, the p type base region 14, an n type drift region 18, an n$^+$ type buffer region 20, a p$^+$ type collector region 22, and an n$^+$ type cathode region 82.

In the IGBT region 70, the emitter region 12 is exposed at the top surface 92 and contacts the trench portion. Between emitter regions 12 in the X-axis direction, the contact region 15 is exposed at the top surface 92 and is provided to a position deeper than the emitter regions 12. The base region 14 may be provided from the top surface 92 to a position deeper than the emitter regions 12 and the contact region 15.

It should be noted that, in the range in which the emitter region 12 and the contact region 15 are provided, the base region 14 does not need to be exposed at the top surface 92. The base region 14 can function as a channel formation region near the gate trench portion 40. In the mesa contact portion 54 on the mesa portion 90, the emitter region 12 contacts the contact region 15. The contact region 15 is exposed at the top surface 92 between the dummy trench portions 30-3.

In the IGBT region 70, the p$^+$ type collector region 22 is exposed at the bottom surface 94 of the semiconductor substrate 10. The collector region 22 of the present example is provided continuously in the X-axis direction to the position of the border 75. In the present example, the IGBT region 70 refers to a portion of the active region 100 that is a virtual region in a case where the collector region 22 is projected onto the top surface 92 from the bottom surface 94 in a direction parallel to the Z-axis direction.

In the FWD region 80, the base region 14 is exposed at the top surface 92 and is provided in contact with the trench portion. The FWD region 80 of the present example does not include the contact region 15 in the mesa portion 90, but the contact region 15 may be included in the mesa portion 90 in order to improve the hole extraction. The base region 14 of the FWD region 80 may be treated as an anode region in a diode. The base region 14 of the FWD region 80 is provided continuously with the IGBT region 70. In one example, the base region 14 may be formed by ion-injecting boron (B) into the entire surface of the semiconductor substrate 10.

In the FWD region 80, the n$^+$ type cathode region 82 is exposed at the bottom surface 94 of the semiconductor substrate 10. The cathode region 82 of the present example is provided continuously in the X-axis direction to the position of the border 75. In the present example, the FWD region 80 refers to a portion of the active region 100 that is a virtual region in a case where the cathode region 82 is projected onto the top surface 92 from the bottom surface 94 in a direction parallel to the Z-axis direction.

Each gate trench portion 40 of the present example includes a gate insulating film 42, a gate conducting portion 43, and a gate trench 44. The gate insulating film 42 may be provided in contact with an inner wall of the gate trench 44. The gate insulating film 42 may be formed by oxidizing or nitriding the semiconductor of the inner wall of the gate trench 44. The gate conducting portion 43 of the present example is provided in contact with the gate insulating film 42 and farther inward than the gate insulating film 42. The gate insulating film 42 may insulate the gate conducting portion 43 and the semiconductor substrate 10 from each other. The gate conducting portion 43 may be formed of a conductive material such as polysilicon.

The dummy trench portions 30-1, 30-2, and 30-3 of the present example each include a dummy trench insulating film 32, a dummy conducting portion 33, and a dummy trench 34. The dummy trench insulating film 32 and the dummy conducting portion 33 may be formed using the same technique as used for the gate insulating film 42 and the gate conducting portion 43.

In the C-C cross section, the interlayer insulating film 26 electrically insulates each of the dummy conducting portions 33 and the gate conducting portions 43 from the emitter electrode 52. Each trench portion may penetrate through the base region 14 and reach the drift region 18. The buffer region 20 may be positioned between the drift region 18 and the collector region 22 and cathode region 82 in the Z-axis direction.

The buffer region 20 may have a function to prevent a depletion layer, which expands from the floor portion of the base region 14 of the IGBT region 70 to the bottom surface 94 when the semiconductor device 200 is turned OFF, from reaching the collector region 22. The buffer region 20 may be a field stop region having an n type doping concentration distribution that has a discrete peak value in the depth direction.

Figure 4:
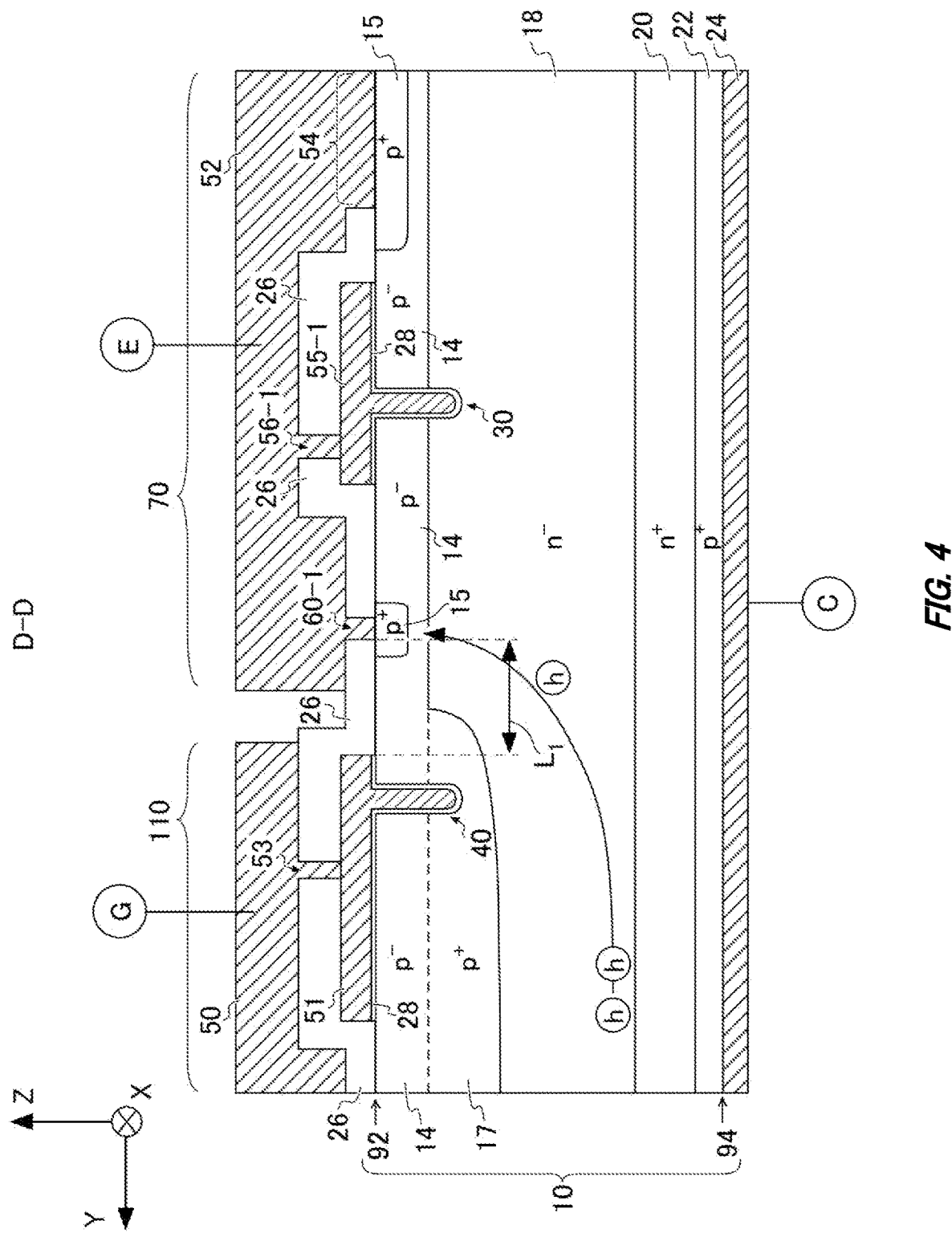
FIG. 4 shows the D-D cross section of FIG. 2.

FIG. 4 shows the D-D cross section of FIG. 2. The D-D cross section is parallel to the Y-Z plane. The D-D cross section passes through an IGBT region 70 and the gate runner portion 110. More specifically, the D-D cross section passes through a short portion 48 of a gate trench portion 40, the peripheral contact portion 60-1, a short portion 38-1 of a dummy trench portion 30, and a mesa contact portion 54 of a mesa portion 90.

As shown in the D-D cross section, the floor portion of the short portion 48 of the gate trench portion 40 is covered from below by the well region 17. The well region 17 does not electrically contact the emitter electrode 52, and therefore the holes remaining in the outer peripheral region of the active region 100 can move within the drift region 18 along the floor portion of the well region 17. In the D-D cross section, the moving holes are indicated by "h". As shown in the drawing, the holes remaining in the outer peripheral region may be extracted through the emitter electrode 52 of the peripheral contact portion 60-1.

In the present example, the peripheral contact portion 60-1 and the gate runner portion 110 are separated by a distance $L_1$. More specifically, the length from the positive Y-axis direction end portion of the peripheral contact portion 60-1 to the negative Y-axis direction end portion of the polysilicon gate runner 51 in the gate runner portion 110 is $L_1$. The collector region 22 is provided directly below the gate runner portion 110. By making the separation distance between the gate runner portion 110 and the contact portion such as the peripheral contact portion 60-1 for extracting holes substantially uniform in the outer peripheral region of the active region 100, it is possible to substantially uniformly extract the holes in the outer peripheral region.

Figure 5:
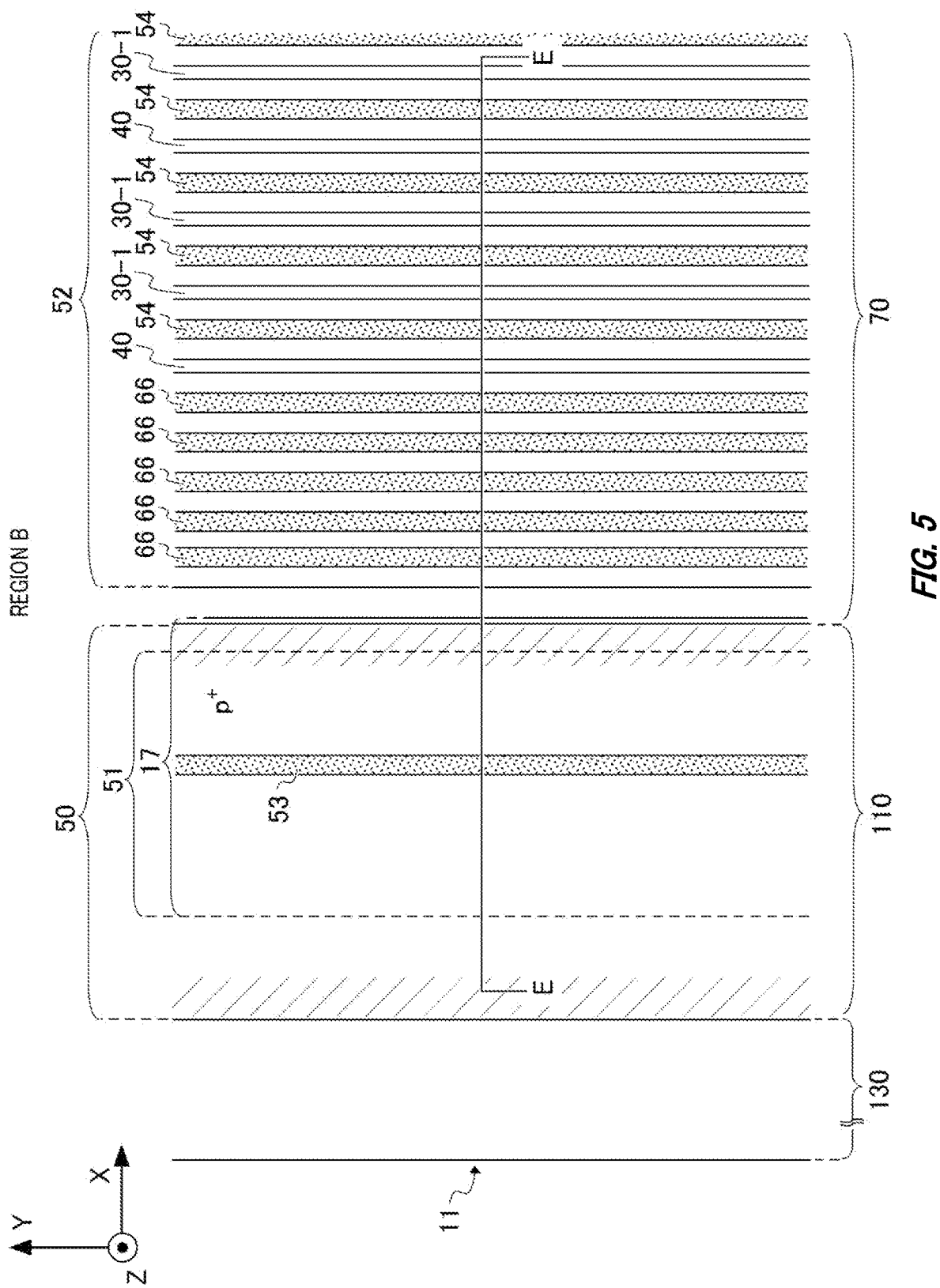
FIG. 5 shows the region B of FIG. 1 according to the first embodiment.

FIG. 5 shows the region B of FIG. 1 according to the first embodiment. The IGBT region 70 may include one or more peripheral longitudinal contact portions 66 extending in the Y-axis direction. The peripheral longitudinal contact portion 66 may be positioned farther outward than the gate trench portion 40 or the dummy trench portion 30-1 positioned farthest outward in the X-axis direction. In the present example, five peripheral longitudinal contact portions 66 are included farther outward than the gate trench portion 40 positioned farthest outward in the X-axis direction. A mesa contact portion 54 is provided on each mesa portion 90 between a gate trench portion 40 and a dummy trench portion 30-1 and on the mesa portion 90 between two dummy trench portions 30-1.

The gate runner portion 110 is a multilayered structure formed by the gate metal layer 50 and the polysilicon gate runner 51 that are electrically connected to each other via the runner contact portion 53, in the same manner as in region A. Furthermore, the well region 17 is provided below the gate runner portion 110, in the same manner as in region A. However, in the X-axis direction outer peripheral region of the active region 100, a trench portion is not provided below the gate runner 51. The region B differs from the region A with regard to this point.

Figure 6:
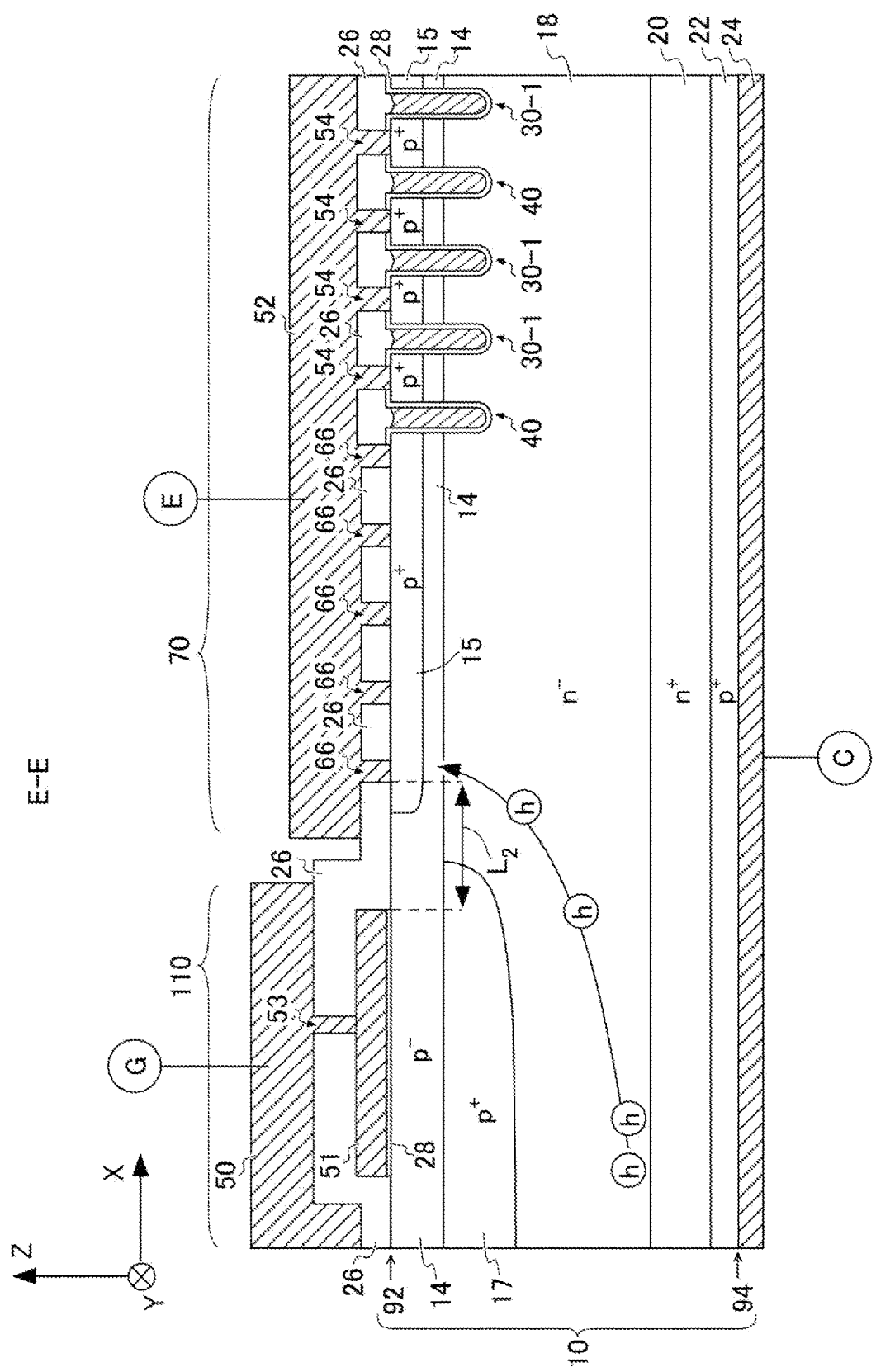
FIG. 6 shows the E-E cross section of FIG. 5.

FIG. 6 shows the E-E cross section of FIG. 5. The E-E cross section is parallel to the X-Z plane. The E-E cross section passes through the gate runner portion 110 and a plurality of peripheral longitudinal contact portions 66. The gate metal layer 50 of the gate runner portion 110 is distanced from the emitter electrode 52 in the X-axis direction, to be electrically insulated from the emitter electrode 52. The holes remaining in the outer peripheral region of the active region 100 move within the drift region 18 and are extracted through the peripheral longitudinal contact portions 66 of the IGBT region 70.

In the present example, the separation distance between the gate runner portion 110 and the peripheral longitudinal contact portion 66 that is closest to the end portion 11 of the semiconductor substrate 10 in the X-axis direction, among one or more peripheral longitudinal contact portions 66, is $L_2$. More specifically, the length from the negative X-axis direction end portion of the peripheral longitudinal contact portion 66 positioned farthest outward to the positive X-axis direction end portion of the polysilicon gate runner 51 in the gate runner portion 110 is $L_2$. In the present example, the distance $L_1$ and the distance $L_2$ are equal. In this way, it is possible to substantially uniformly extract the holes across the entire outer peripheral region of the active region 100.

Figure 7:
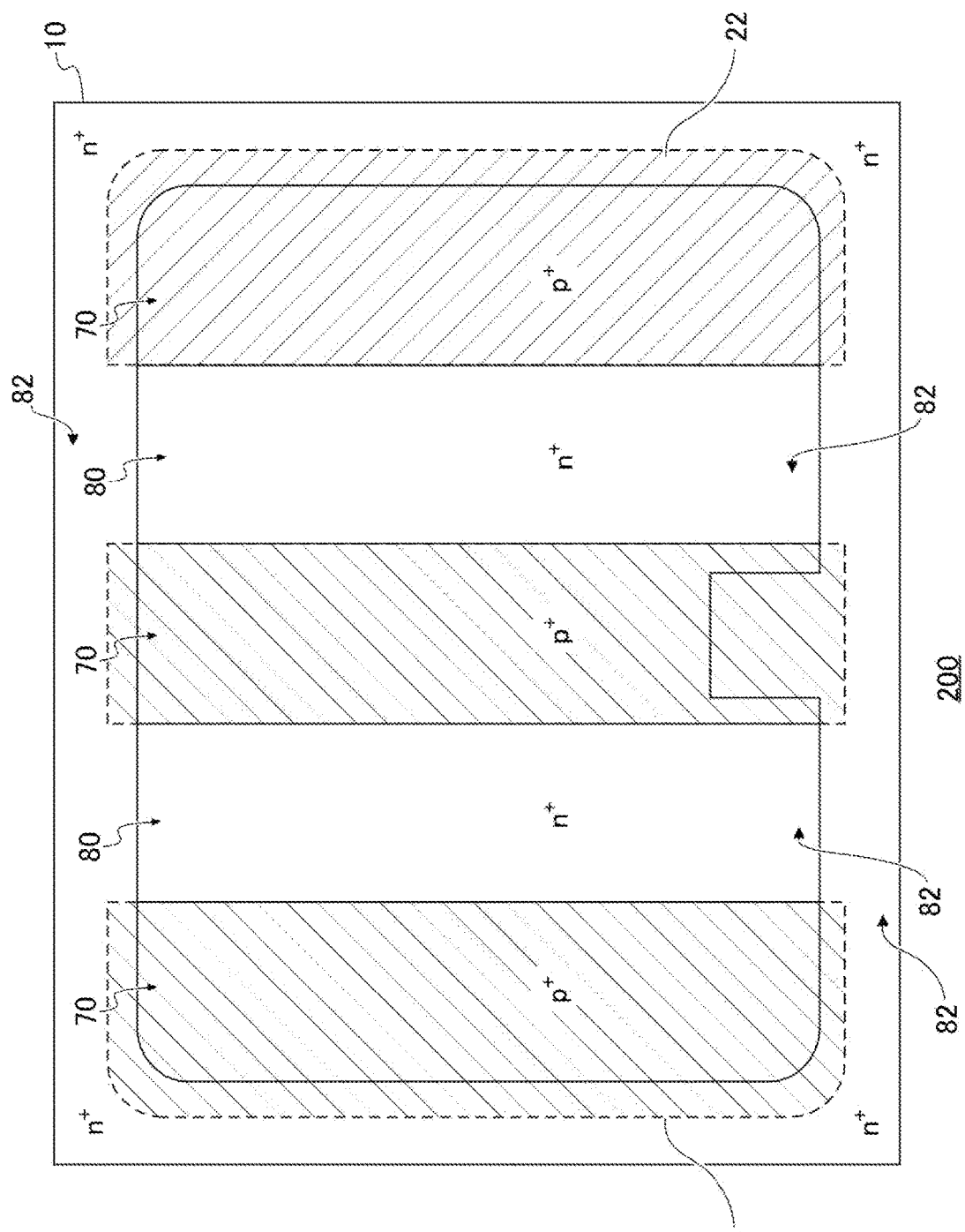
FIG. 7 shows the ranges of the $p^+$ collector regions 22 and the range of the $n^+$ cathode regions 82 on the bottom surface 94.

FIG. 7 shows the ranges of the p$^+$ collector regions 22 and the range of the n$^+$ cathode region 82 on the bottom surface 94. In FIG. 7, the ranges of the IGBT regions 70 and the FWD regions 80 are shown by solid lines. Furthermore, the ranges in which the collector regions 22 are provide are shown by dashed lines. On the bottom surface 94 of the present example, the collector regions 22 are provided discretely within the range of the cathode region 82. The collector regions 22 are provided in wider ranges than the IGBT regions 70. The portions where the solid lines of the IGBT regions 70 and the dashed lines of the collector regions 22 overlap are shown as solid lines.

In the present example, the holes that have been injected to the outer peripheral portion of an IGBT region 70 (i.e. the portion where the IGBT region 70 contacts the gate runner portion 110) when the IGBT is ON can be extracted through the peripheral contact portions 60-1 and 60-2 when the IGBT is OFF. Furthermore, the holes flowing around and into each FWD region 80 from the IGBT regions 70 adjacent thereto in the X-axis direction can be extracted from the peripheral contact portion 60-2 of the FWD region 80 to the emitter electrode 52.

Figure 8:
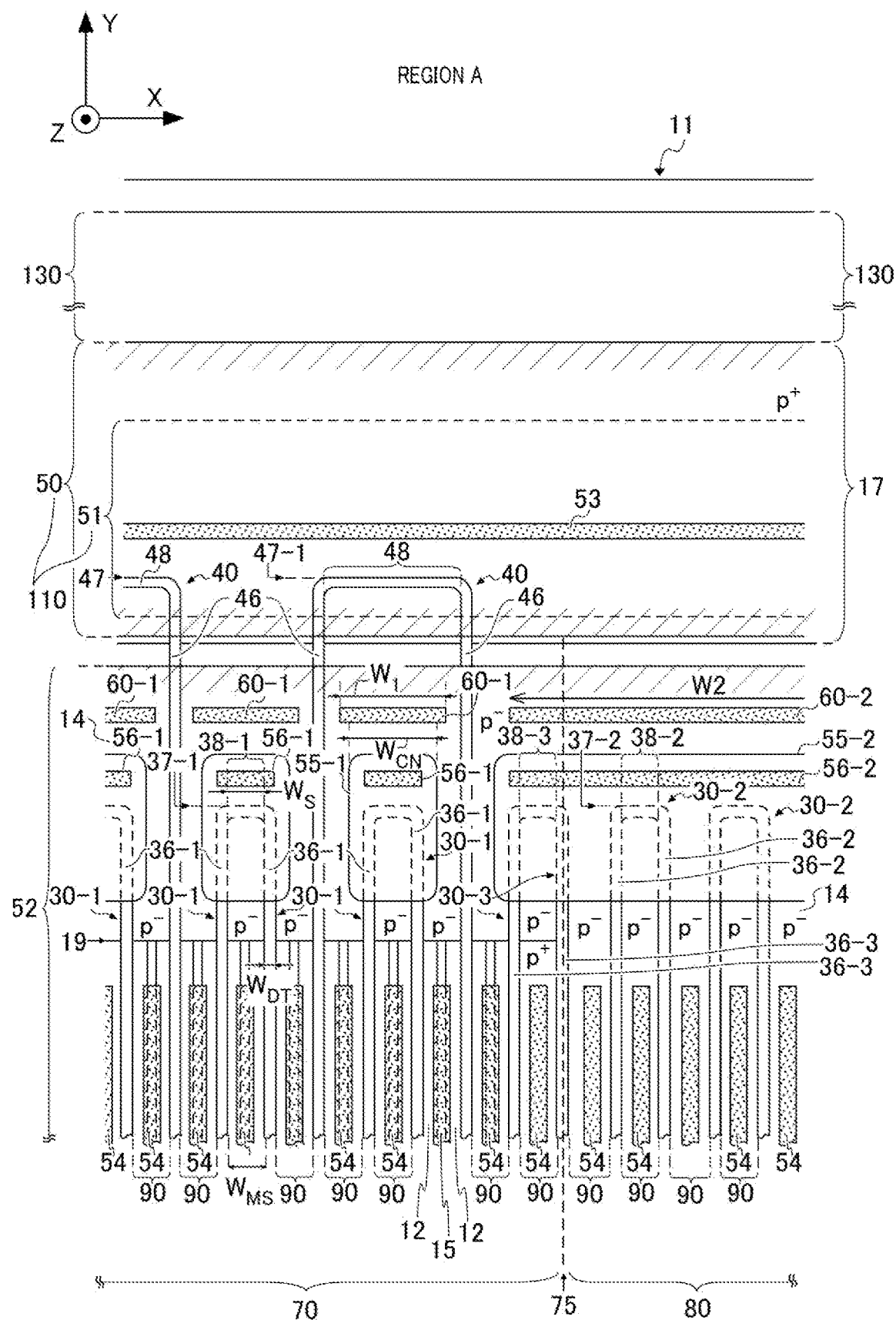
FIG. 8 shows a first modification of the region A.

FIG. 8 shows a first modification of the region A. In the present example, the width $W_1$ of the peripheral contact portion 60-1 in the X-axis direction is greater than the width $W_{CN}$ of the connection layer 55-1 in the X-axis direction. In the present example, the width $W_{CN}$ of the connection layer 55-1 in the X-axis direction is the maximum width of the connection layer 55-1 in the X-axis direction. The greater the width $W_1$ of the peripheral contact portion 60-1, the greater the surface area of the peripheral contact portion 60-1, and therefore a greater width has a benefit of making it easier to extract the carriers remaining in the outer peripheral region.

The $p^+$ type contact region 15 provided directly below the peripheral contact portion 60-1 may be provided corresponding to the shape of the peripheral contact portion 60-1 of the present example. The range in the X-Y plane direction of the peripheral contact portion 60-1 of the present example may be smaller than the range in the X-Y plane direction of the contact region 15 directly below the peripheral contact portion 60-1 and contained in the range in the X-Y plane direction of the contact region 15. By making the range of the contact region 15 larger than the range of the corresponding peripheral contact portion 60-1, it is possible to effectively utilize the entire range of the expanded peripheral contact portion 60-1.

Figure 9:
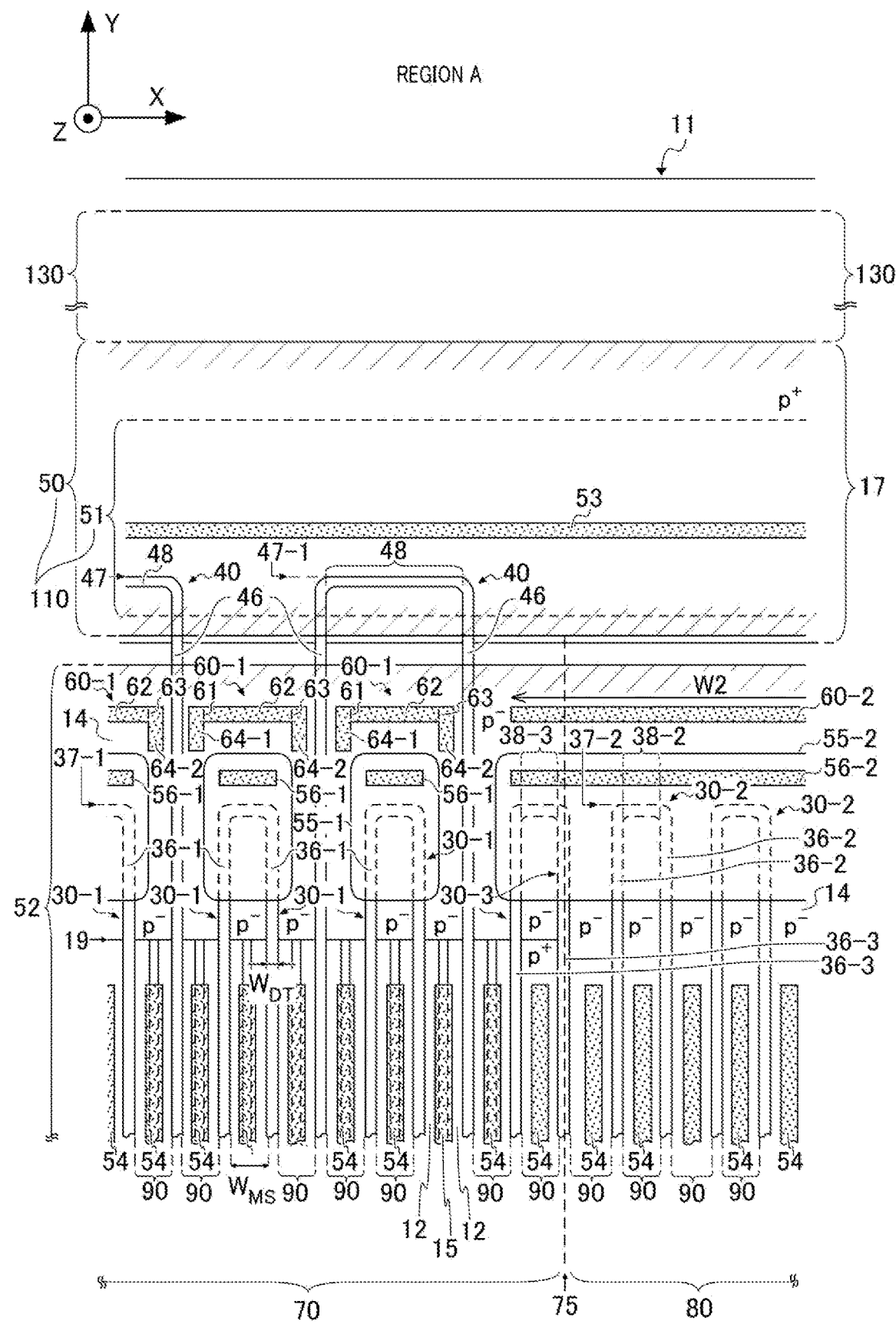
FIG. 9 shows a second modification of the region A.

FIG. 9 shows a second modification of the region A. The peripheral contact portion 60-1 of the present example includes main regions 62 and sub regions 64. Each main region 62 is a region extending parallel to the X-axis direction in which the short portion 38 of a dummy trench portion 30-1 extends. In contrast to this, each sub region 64 is a region connected to a main region 62 and extending in a direction from the main region 62 toward the dummy trench portion 30-1. In order to facilitate understanding, the borders between the main regions 62 and the sub regions 64 are shown with dashed lines.

Each peripheral contact portion 60-1 of the present example includes one main region 62 and two sub regions 64. The sub regions 64 of the present example are connected respectively to the X-axis direction end portions of the main region 62. The two sub regions 64 include a first sub region 64-1 and a second sub region 64-2. In the present example, the first sub region 64-1 is connected to a first end portion 61 on an X-axis direction side of the main region 62 and extends in a direction toward the dummy trench portion 30-1. Furthermore, the second sub region 64-2 is connected to a second end portion 63 on an X-axis direction side of the main region 62 and extends in a direction toward the dummy trench portion 30-1. The second end portion 63 is a different X-axis direction end portion of the main region 62 than the first end portion 61. Each sub region 64 of the present example extends parallel to the Y-axis direction, but in another example, each sub region 64 does not need to extend parallel to the Y-axis direction. In the present example, compared to a case where only the main region 62 is provided, the surface area of the peripheral contact portion 60-1 can be increased. Therefore, there is a benefit that the carriers remaining in the outer peripheral region can be more easily extracted.

The sub region 64 is not limited to the shape of the present example. The sub region 64 may have any shape that does not overlap with any dummy trench portion 30, gate trench portion 40, or connection layer 55 in the Z-axis direction. In one example, the sub region 64 may extend in a direction inclined relative to, and not parallel to, both the X-axis direction and the Y-axis direction.

In the present example, the $p^+$ type contact region 15 provided directly below the peripheral contact portion 60-1 is provided corresponding to the shape of the peripheral contact portion 60-1 of the present example. The range in the X-Y plane direction of the peripheral contact portion 60-1 of the present example is less than the range in the X-Y plane direction of the contact region 15 directly below the peripheral contact portion 60-1 and is also contained within the range in the X-Y plane direction of the contact region 15. Therefore, it is possible to effectively utilize the entire range of the expanded peripheral contact portion 60-1.

Figure 10:
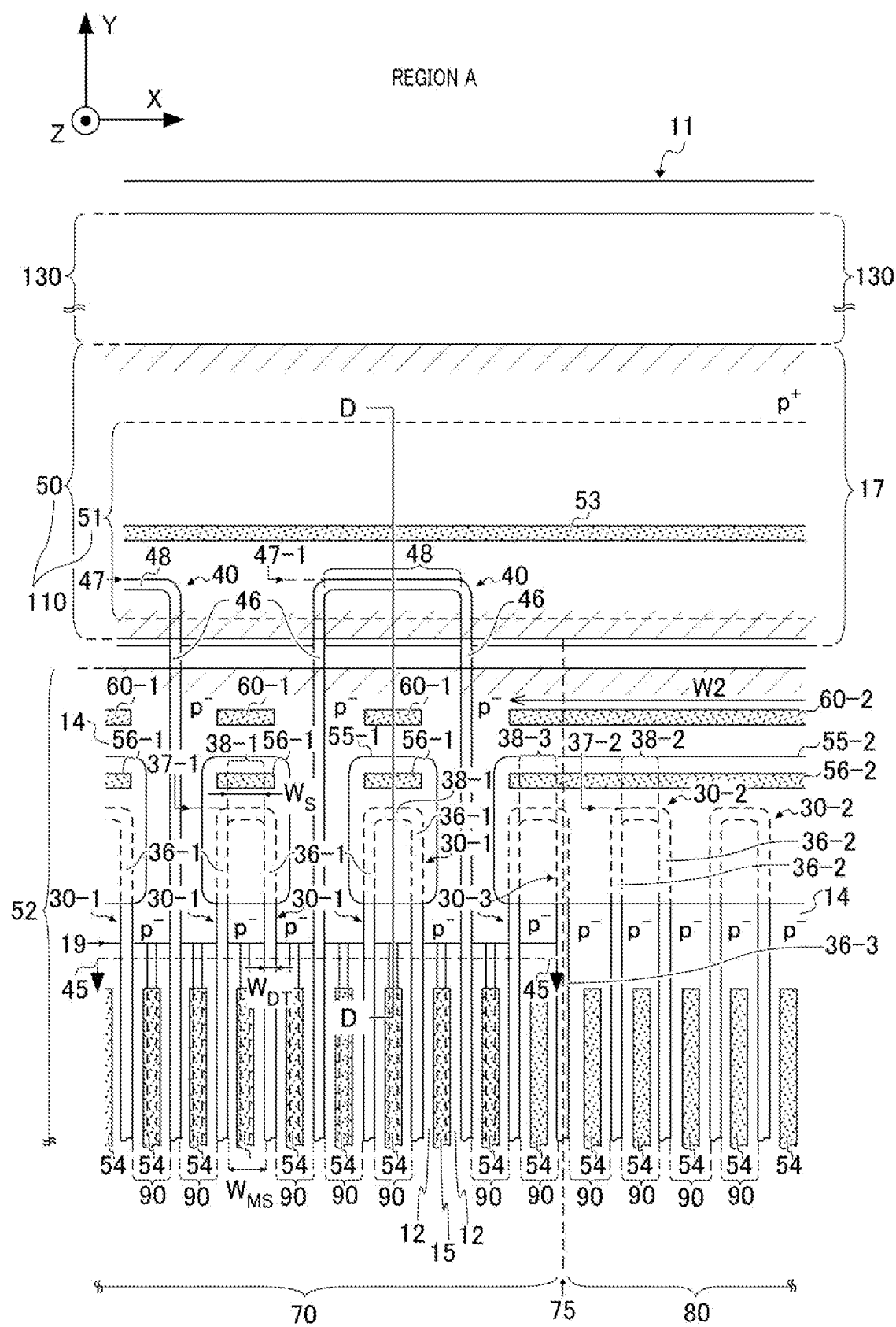
FIG. 10 shows the region A according to a second embodiment.

FIG. 10 shows the region A according to a second embodiment. The IGBT region 70 in the present example includes an $n^+$ type charge accumulation region 45. The second embodiment differs from the first embodiment with regard to this point. Other points are the same as in the first embodiment. By providing the charge accumulation region 45, which has a higher n type doping concentration than the drift region 18, in the IGBT region 70, it is possible to strengthen the carrier injection enhancement effect (IE effect). Therefore, compared to a case where the charge accumulation region 45 is not provided, it is possible to reduce the ON voltage of the IGBT.

Figure 11:
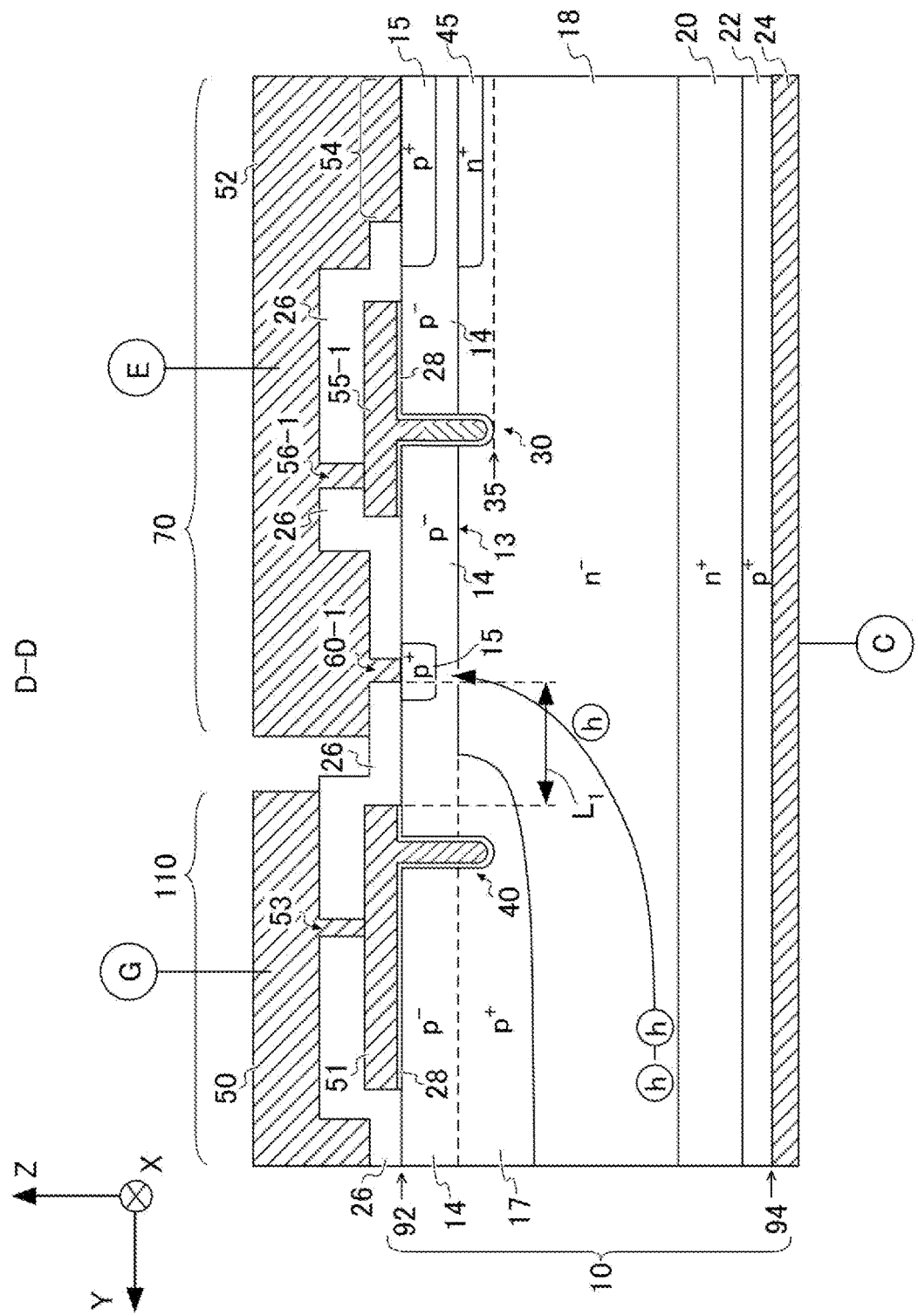
FIG. 11 shows the D-D cross section of FIG. 10.

FIG. 11 shows the D-D cross section of FIG. 10. The D-D cross section is parallel to the Y-Z plane and passes through an IGBT region 70 and the gate runner portion 110, in the same manner as in FIG. 4. The charge accumulation region 45 may be provided between the floor portion 35 of the dummy trench portion 30-1 and the floor portion 13 of the base region 14, in the depth direction of the semiconductor substrate 10. Furthermore, the charge accumulation region 45 may be provided farther inward than the peripheral contact portion 60-1 in the X-Y plane direction that is orthogonal to the depth direction. The charge accumulation region 45 of the present example may be provided continuously from the positive Y-axis direction end portion. However, the charge accumulation region 45 is provided in a prescribed depth range that is shallower than the floor portion of the trench portion, and therefore is not provided in a region where a trench portion is provided.

The positive Y-axis direction end portion of the charge accumulation region 45 of the present example is positioned farther in the negative Y-axis direction than the negative Y-axis direction end portion of the peripheral contact portion 60-1, and is positioned farther in the negative Y-axis direction than the negative Y-axis direction end portion of the connection layer 55-1. In the present example, the charge accumulation region 45 is not provided below the peripheral contact portion 60-1. Therefore, it is possible to avoid a situation where the charge accumulation region 45 captures holes below the peripheral contact portion 60-1, and to reduce the ON voltage through the IE effect.

Figure 12:
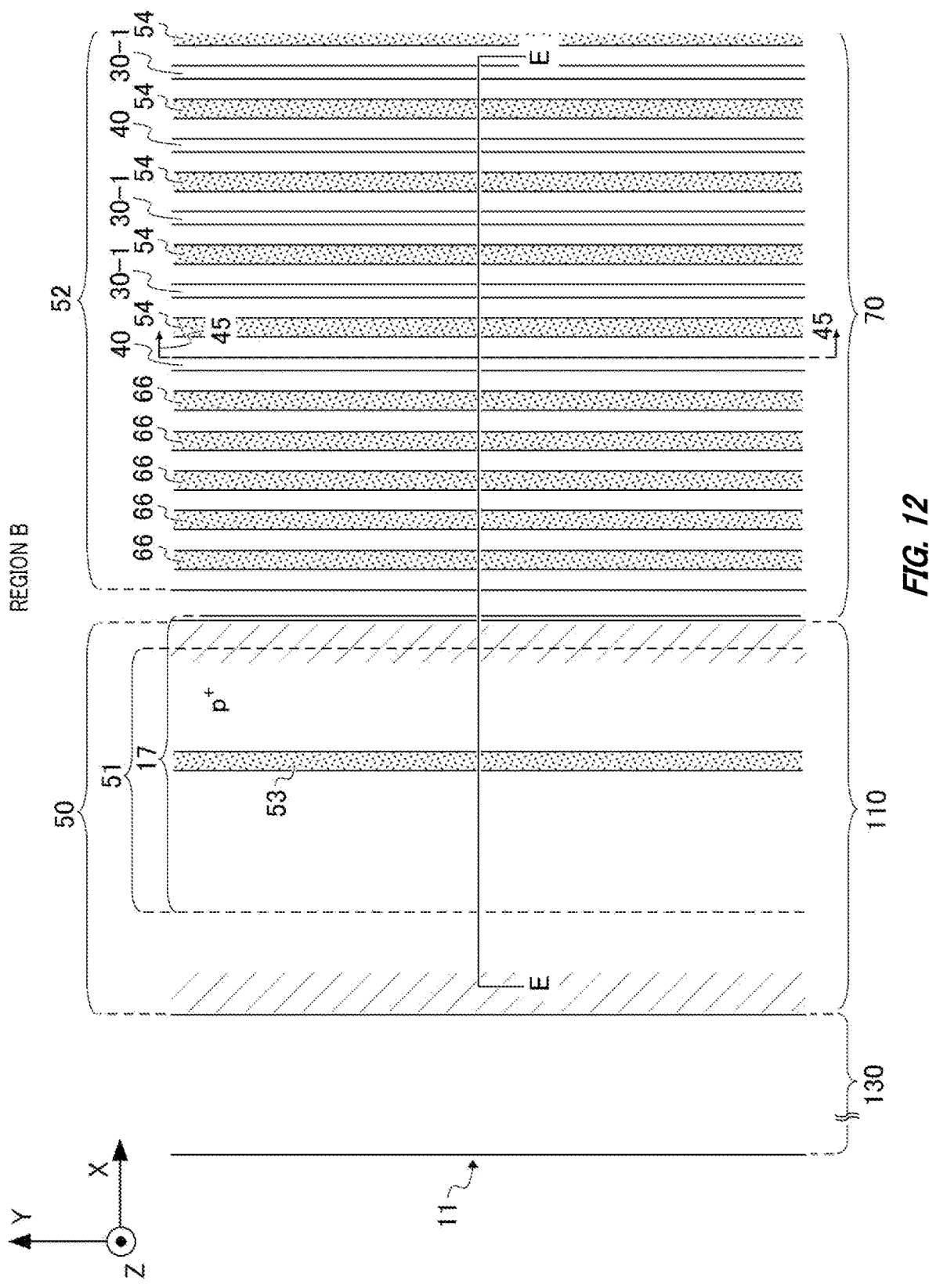
FIG. 12 shows the region B according to the second embodiment.

FIG. 12 shows the region B according to the second embodiment. The charge accumulation region 45 of the present example may be provided continuously in the arrow direction from the negative X-axis direction end portion indicated by the dashed line. However, the charge accumulation region 45 is not provided in portions where a trench portion is provided, as described above.

Figure 13:
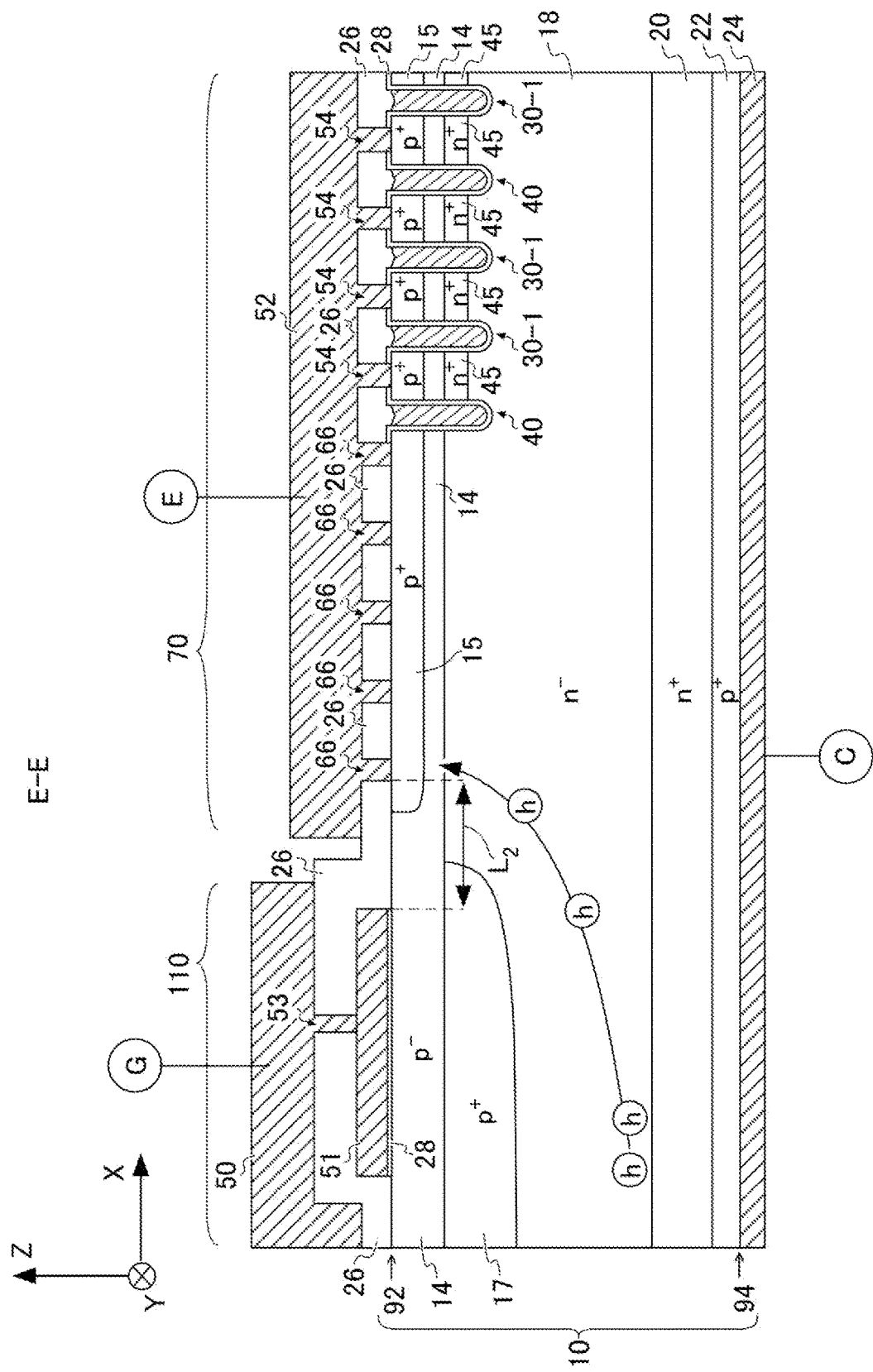
FIG. 13 shows the E-E cross section of FIG. 12.

FIG. 13 shows the E-E cross section of FIG. 12. The E-E cross section is parallel to the X-Z plane and passes through the gate runner portion 110 and a plurality of peripheral longitudinal contact portions 66, in the same manner as in FIG. 5. The negative X-axis direction end portion of the charge accumulation region 45 may be positioned farther in the positive X-axis direction than the peripheral longitudinal contact portion 66 that is farthest inward (i.e. farthest in the positive X-axis direction). In the present example, the negative X-axis direction end portion of the charge accumulation region 45 positioned farthest outward (i.e. farthest in the negative X-axis direction) may match the inward end portion of the gate trench portion 40 that is farthest outward. In the present example as well, the charge accumulation region 45 is not provided below the peripheral longitudinal contact portion 66. Therefore, it is possible to avoid a situation where the charge accumulation region 45 captures holes below the peripheral longitudinal contact portion 66, and to reduce the ON voltage through the IE effect.

Figure 14:
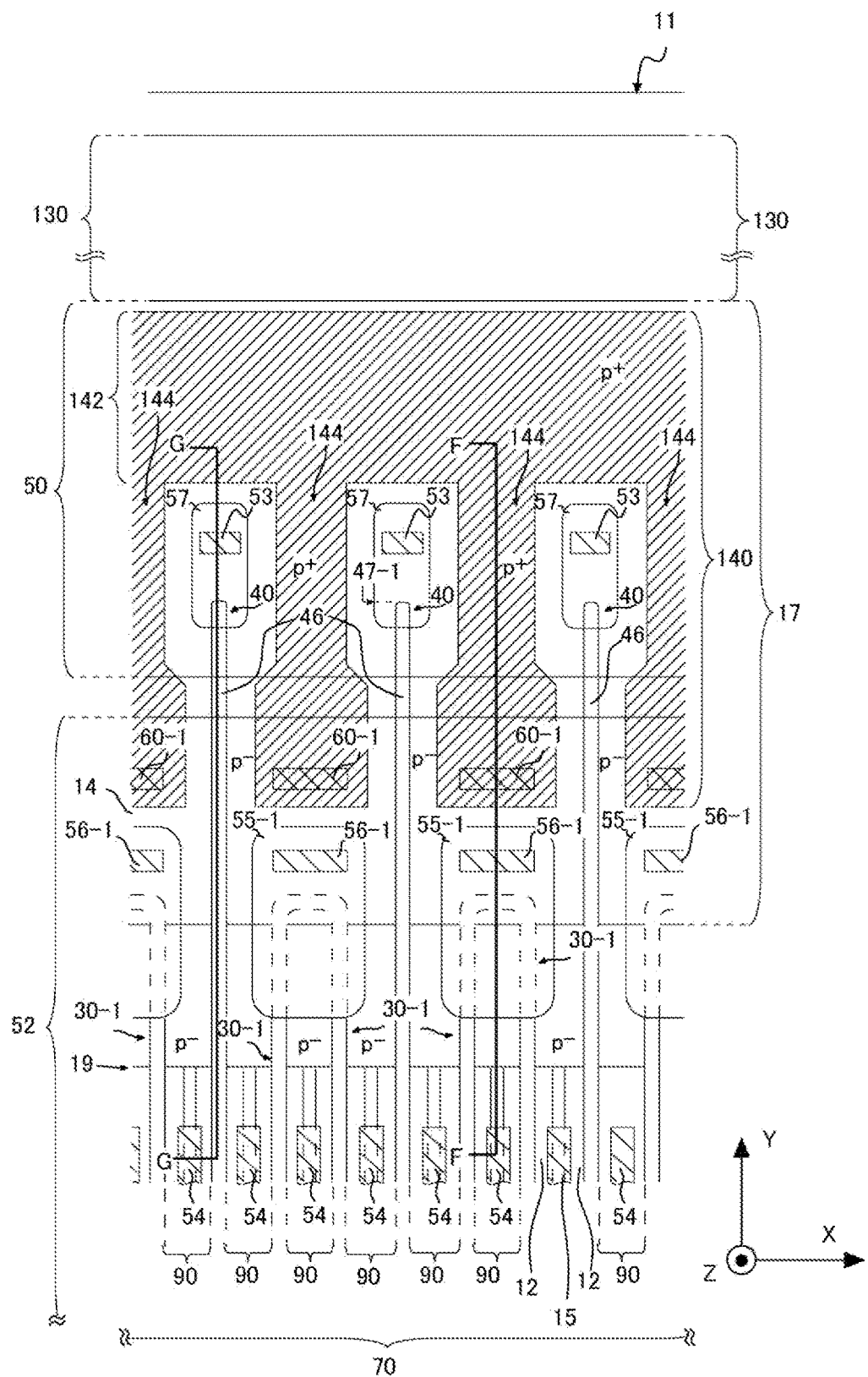
FIG. 14 shows an IGBT region 70 according to a third embodiment.

FIG. 14 shows an IGBT region 70 according to a third embodiment. The IGBT region 70 of the present example is included in the region A of FIG. 1. The IGBT region 70 of the present example includes a high concentration region 140 connected to the emitter electrode 52 by first contact portions 60-1. In FIG. 14, hatching with diagonal lines is shown in the range where the high concentration region 140 is provided in the X-Y plane. The structure of the IGBT region 70 other than the high concentration region 140 may be the same the structure of the IGBT region 70 according to any of the aspects described in FIGS. 1 to 13.

The high concentration region 140 is a region having a first conductivity type with a higher doping concentration than the base region 14. The high concentration region 140 of the present example is $p^+$ type. The high concentration region 140 may have the same doping concentration as the contact region 15 described in FIGS. 1 to 13. The high concentration region 140 is provided between the base region 14 and the top surface 92 of the semiconductor substrate 10. The high concentration region 140 of the present example is exposed at the top surface 92 of the semiconductor substrate 10. The depth to which the high concentration region 140 is provided may be the same as the depth to which the contact region 15 is provided.

The high concentration region 140 is connected to the first contact portions 60-1 at the top surface 92 of the semiconductor substrate 10. The high concentration region 140 is provided continuously from below the first contact portions 60-1 to below the gate metal layer 50. With such a configuration, when the IGBT region 70 is turned OFF, the carriers such as holes that flow to the active region 100 from farther outward than the gate metal layer 50 (i.e. from the edge termination region 130 side) can pass through the high concentration region 140 that has a relatively low resistance and be extracted to the emitter electrode 52. Furthermore, since the high concentration region 140 is connected to the first contact portion 60-1, the carriers that have passed through the high concentration region 140 can be extracted to the emitter electrode 52 at the end portion of the active region 100. Therefore, the elements such as transistors formed in the active region 100 can be protected.

The high concentration region 140 of the present example includes one of more extending portions 144. Furthermore, at least one gate trench portion 40 has a Y-axis direction end portion 47-1 arranged below the gate metal layer 50. Each extending portion 144 is provided extending in the Y-axis direction from below the first contact portion 60-1 to below the gate metal layer 50, between two gate trench portions 40. Each extending portion 144 is arranged separated from the gate trench portions 40 in an overhead view.

Each extending portion 144 may be provided extending farther outward than the end portion 47-1 of the gate trench portion 40. Here, "outward" refers to the side closer to the end portion 11 of the semiconductor substrate 10. In the present example, each extending portion 144 extends farther to the edge termination region 130 side than the end portion 47-1 of the gate trench portion 40. With such a configuration, it is possible to provide the high concentration region 140 extending farther outward, and to lower the resistance of the path through which the carriers pass.

The high concentration region 140 may be provided for a plurality of the first contact portions 60-1. Each extending portion 144 may extend farther outward than the end portion 47-1 of the gate trench portion 40. The high concentration region 140 may include an outer connecting portion 142 that connects the plurality of extending portions 144. The outer connecting portion 142 is provided farther outward than the end portion 47-1 in the Y-axis direction. With such a configuration, it is possible to lower the resistance of the path through which the carriers such as holes pass, farther outward than the end portion 47-1. Furthermore, the outer connecting portion 142 may be provided with an annular shape surrounding the active region 100. In this way, almost all of the holes heading from the edge termination region 130 or the like toward the active region 100 can pass through the high concentration region 140.

The semiconductor device 200 of the present example includes a gate connection portion 57 that connects the end portion 47-1 of the gate trench portion 40 to the gate metal layer 50. The gate connection portion 57 of the present example is polysilicon with impurities added thereto. A gate connection portion 57 is provided for each end portion 47-1 of a gate trench portion 40. The gate connection portions 57 are arranged distanced from each other. In other words, the gate connection portions 57 are arranged discretely in the X-axis direction.

A gate insulating film such as an oxide film is provided between the semiconductor substrate 10 and the gate connection portions 57 in the Z-axis direction. The gate insulating film is provided with openings for connecting the gate connection portions 57 to the gate conducting portions 43 of the gate trench portions 40.

An interlayer insulating film 26 is provided between the gate metal layer 50 and the gate connection portions 57 in the Z-axis direction. The interlayer insulating film 26 is provided with runner contact portions 53. The gate metal layer 50 is connected to the gate connection portions 57 through the runner contact portions 53.

The high concentration region 140 is arranged in a region that does not overlap with the gate connection portion 57 in the overhead view. Each extending portion 144 passes between two gate connection portions 57 and extends farther outward than the end portions 47-1 of the gate trench portions 40 and the gate connection portions 57. The outer connecting portion 142 is connected to each extending portion 144 at positions farther outward than the gate connection portions 57. The high concentration region 140 is arranged at a distance from the gate connection portion 57, in the overhead view.

By discretely arranging the gate connection portions 57, it is possible for the extending portions 144 to extend farther outward than the gate connection portions 57, without overlapping with the gate connection portions 57. A gate insulating film is provided below the gate connection portions 57. When the high concentration region 140 is provided below the gate insulating film, there are cases where the withstand voltage of the gate insulating film drops. According to the present example, the extending portions 144 can extend farther outward than the gate connection portions 57, while the withstand voltage of the gate insulating film is maintained. In a case where the gate insulating film is provided in a region wider than the gate connection portions 57 in the overhead view, the high concentration region 140 is preferably arranged in a manner to not overlap with the gate insulating film.

At least some of the gate trench portions 40 may have a linear shape in the overhead view. The end portion of this linear shape is arranged below a gate metal layer 50. In the present example, all of the gate trench portions 40 have linear shapes. As an example, each gate trench portion 40 includes a long portion 46, but does not include the short portion 48 described in FIG. 2 and the like. Each gate trench portion 40 is provided extending in the Y-axis direction.

The extending portion 144 of each high concentration region 140 is arranged between the linear shapes of two gate trench portions 40 (i.e. between two long portions 46). Each extending portion 144 passes between the end portions 47-1 of the two long portions 46 and extends farther outward than the end portions 47-1. By forming the gate trench portions 40 with linear shapes in this way, the high concentration region 140 can be arranged between each long portion 46. Therefore, it is possible to provide an extending portion 144 to each first contact portion 60-1 and to have each extending portion 144 extend farther outward than the end portions 47-1 of the gate trench portions 40.

Figure 15:
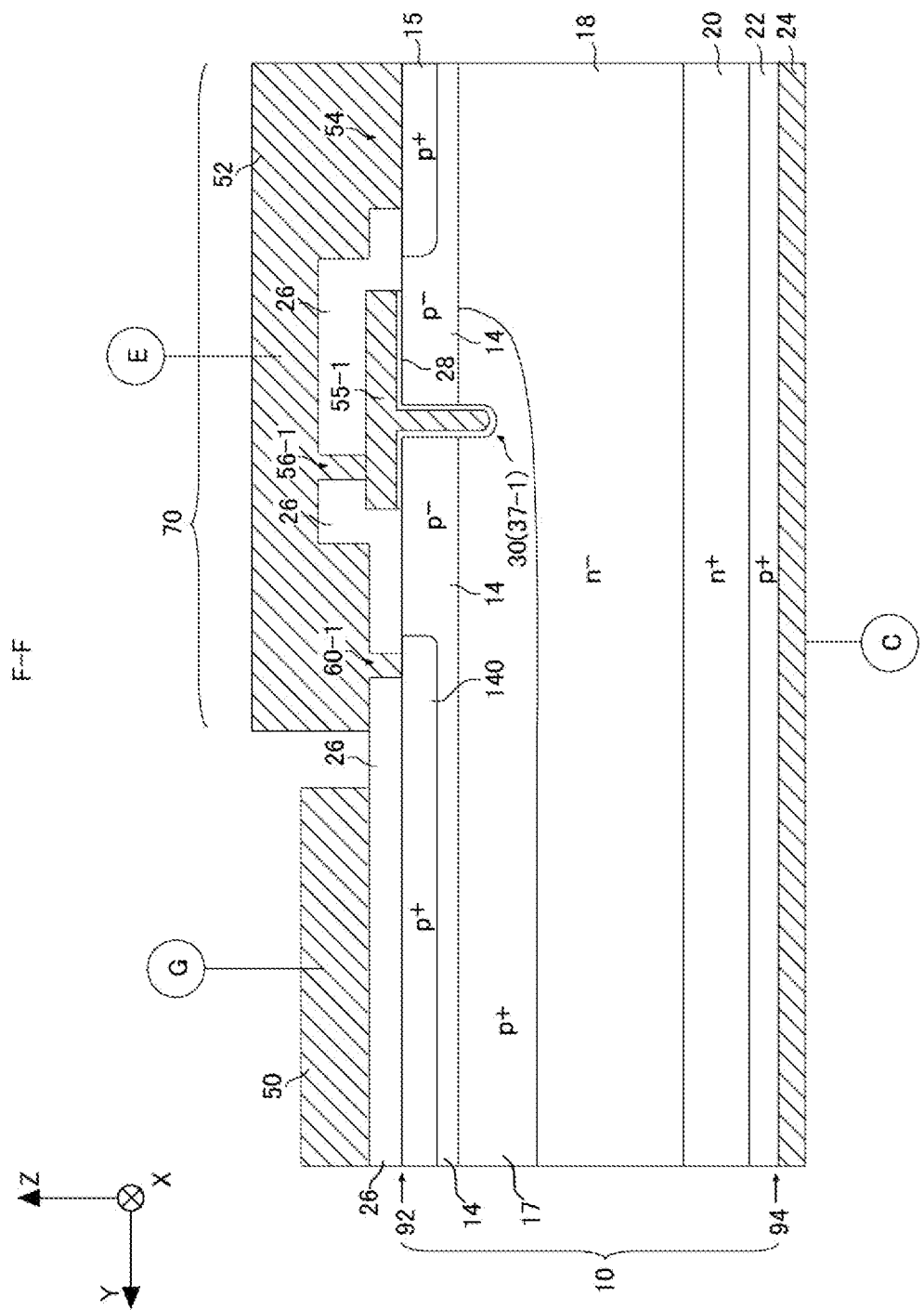
FIG. 15 shows the F-F cross section of FIG. 14.

FIG. 15 shows the F-F cross section of FIG. 14. The F-F cross section is a Y-Z plane passing through a first contact portion 60-1. FIG. 15 shows a cross section from the gate metal layer 50 to the mesa contact portion 54 of an IGBT region 70.

As shown in FIG. 14 as well, the high concentration region 140 is provided extending in the Y-axis direction from a first contact portion 60-1 to below the gate metal layer 50. In this way, it is possible for the holes to pass through the high concentration region 140 having low resistance below the gate metal layer 50.

The high concentration region 140 may be provided farther outward in the Y-axis direction than the center of the gate metal layer 50. The high concentration region 140 may be provided extending in the Y-axis direction to the outward end portion of the gate metal layer 50 or to a position farther outward than the outward end portion of the gate metal layer 50. The high concentration region 140 may be provided below the edge termination region 130.

The well region 17 shown in FIG. 15 is provided until below the IGBT region 70. More specifically, the well region 17 extends to a position farther inward (i.e. closer to the center of the active region 100) than the end portion 37-1 of the dummy trench portion 30. The end portion 37-1 of the dummy trench portion 30 may be surrounded by the well region 17.

In the example shown in FIG. 4, the well region 17 terminates in the Y-axis direction between the end portion 47-1 of a gate trench portion 40 and the end portion 37-1 of a dummy trench portion 30. In each embodiment, the well region 17 may have the form shown in FIGS. 1 and 4 or may have the form shown in FIGS. 14 and 15. The high concentration region 140 may be a region with a higher doping concentration than the well region 17.

Figure 16:
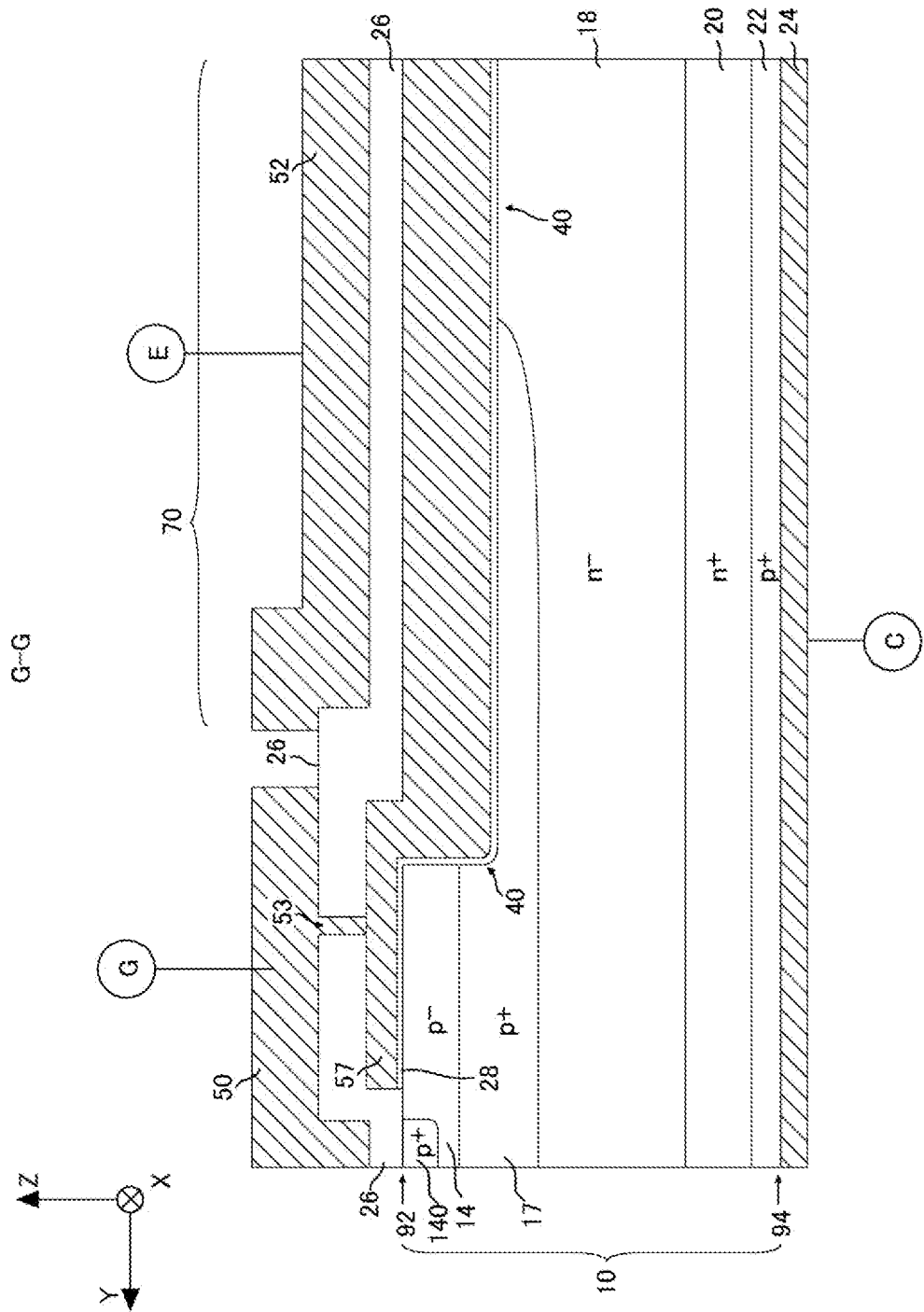
FIG. 16 shows the G-G cross section of FIG. 14.

FIG. 16 shows the G-G cross section of FIG. 14. The G-G cross section is a Y-Z plane passing through a gate connection portion 57, a runner contact portion 53, and a gate trench portion 40. FIG. 16 shows a cross section from the gate metal layer 50 to an IGBT region 70.

As described above, the oxide film 28 serving as the gate insulating film is provided between the gate connection portion 57 and the semiconductor substrate 10. The high concentration region 140 is arranged in a manner to not overlap with the gate connection portion 57 and the oxide film 28 in the Z-axis direction. In this way, it is possible to maintain the withstand voltage of the oxide film 28 while providing the high concentration region 140 to encourage the extraction of holes.

Figure 17:
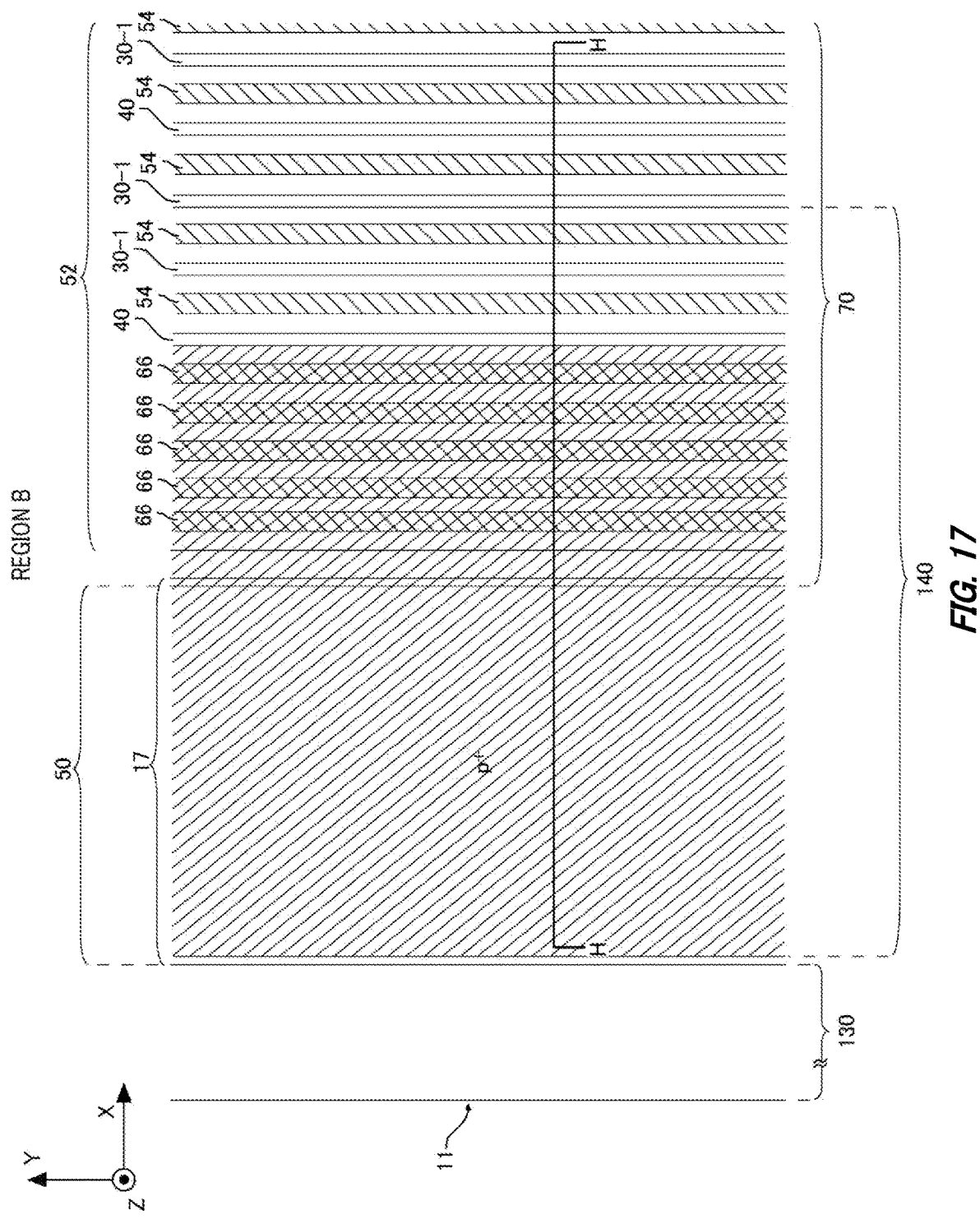
FIG. 17 shows a modification of the region B.

FIG. 17 shows a modification of the region B. As described above, the region B includes one or more peripheral longitudinal contact portions 66 that are positioned farther outward than the gate trench portion 40 or the first dummy trench portion 30-1 positioned farthest outward in the X-axis direction, and extend in the Y-axis direction.

The high concentration region 140 of the present example is provided to a peripheral longitudinal contact portion 66 as well. In other words, the high concentration region 140 is provided below the peripheral longitudinal contact portion 66 and is connected to the peripheral longitudinal contact portion 66. The high concentration region 140 may be connected to some peripheral longitudinal contact portions 66 among a plurality of peripheral longitudinal contact portions 66 arranged in the X-axis direction, or may be connected to all of these peripheral longitudinal contact portions 66.

The high concentration region 140 is provided extending in the X-axis direction from below at least some of the peripheral longitudinal contact portions 66 to below the gate metal layer 50. The high concentration region 140 may be provided extending in the X-axis direction to a position farther outward than the center of the gate metal layer 50. The high concentration region 140 may be provided extending in the X-axis direction to the outward end portion of the gate metal layer 50 or farther outward than the outward end portion of the gate metal layer 50. The high concentration region 140 may be provided extending to below the edge termination region 130.

In the present example, the gate connection portion 57 and the runner contact portion 53 are not provided below the gate metal layer 50 that extends in the Y-axis direction. With such a configuration, the high concentration region 140 can be provided continuously in the Y-axis direction below the gate metal layer 50. Therefore, almost all of the holes from the edge termination region 130 can pass through the high concentration region 140.

The high concentration region 140 in FIG. 17 is arranged farther outward than a gate trench portion 40 or a first dummy trench portion 30-1. In another example, the high concentration region 140 may be provided extending to a position farther inward than at least one gate trench portion 40 or at least one first dummy trench portion 30-1.

Figure 18:
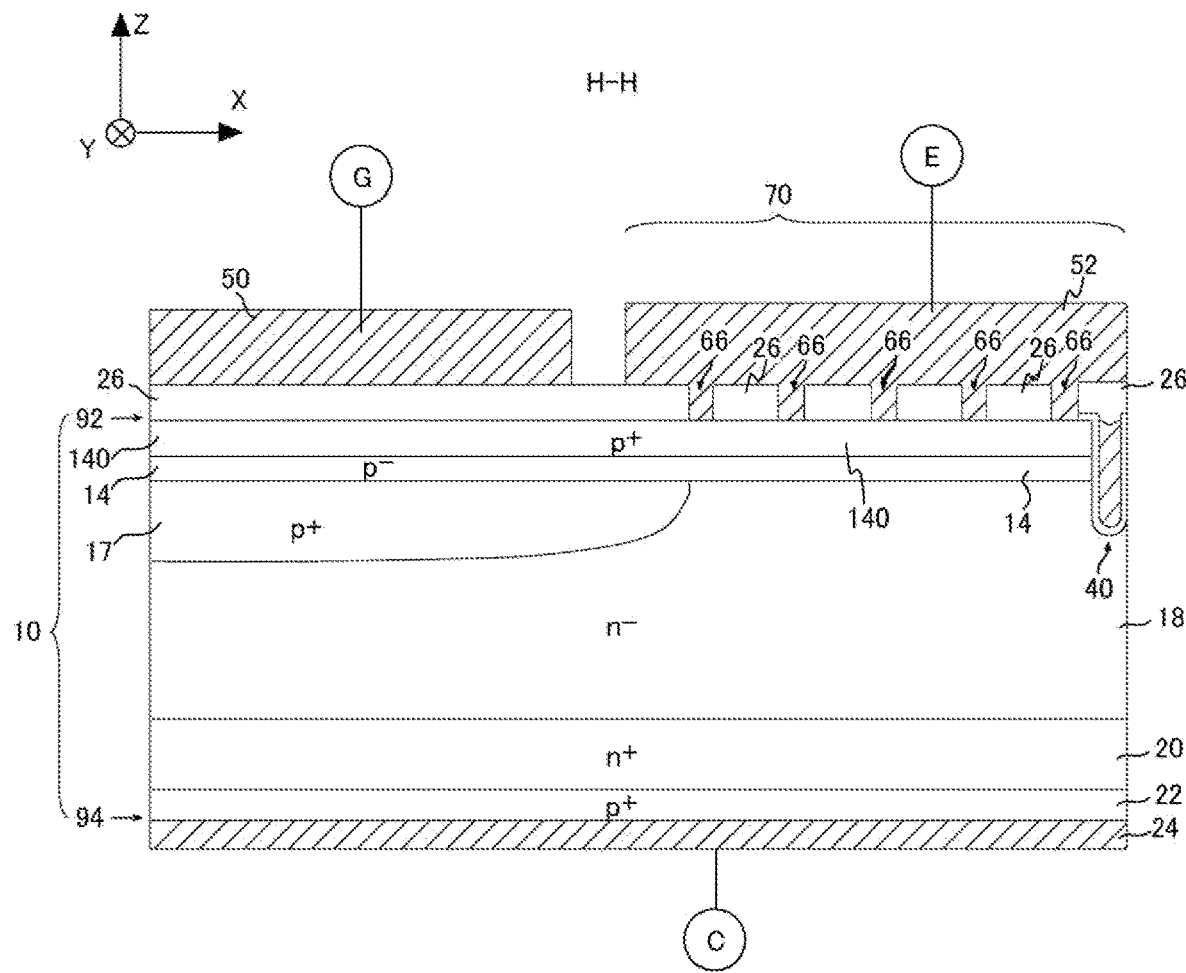
FIG. 18 shows the H-H cross section of FIG. 17.

FIG. 18 shows the H-H cross section of FIG. 17. The H-H cross section is an X-Z cross section from the gate metal layer 50 to the trench portion that is farthest outward (a gate trench portion 40 in the present example). As described above, the high concentration region 140 is provided extending in the X-axis direction from below at least some of the peripheral longitudinal contact portions 66 to below the gate metal layer 50. In this way, the holes heading in the X-axis direction from the outside of the gate metal layer 50 toward the active region 100 can pass through the high concentration region 140.

The well region 17 is provided in a wider range than the gate metal layer 50, below the gate metal layer 50. The well region 17 may be provided in a narrower range than the high concentration region 140. The well region 17 of the present example has the inner end portion thereof arranged in the IGBT region 70.

Figure 19:
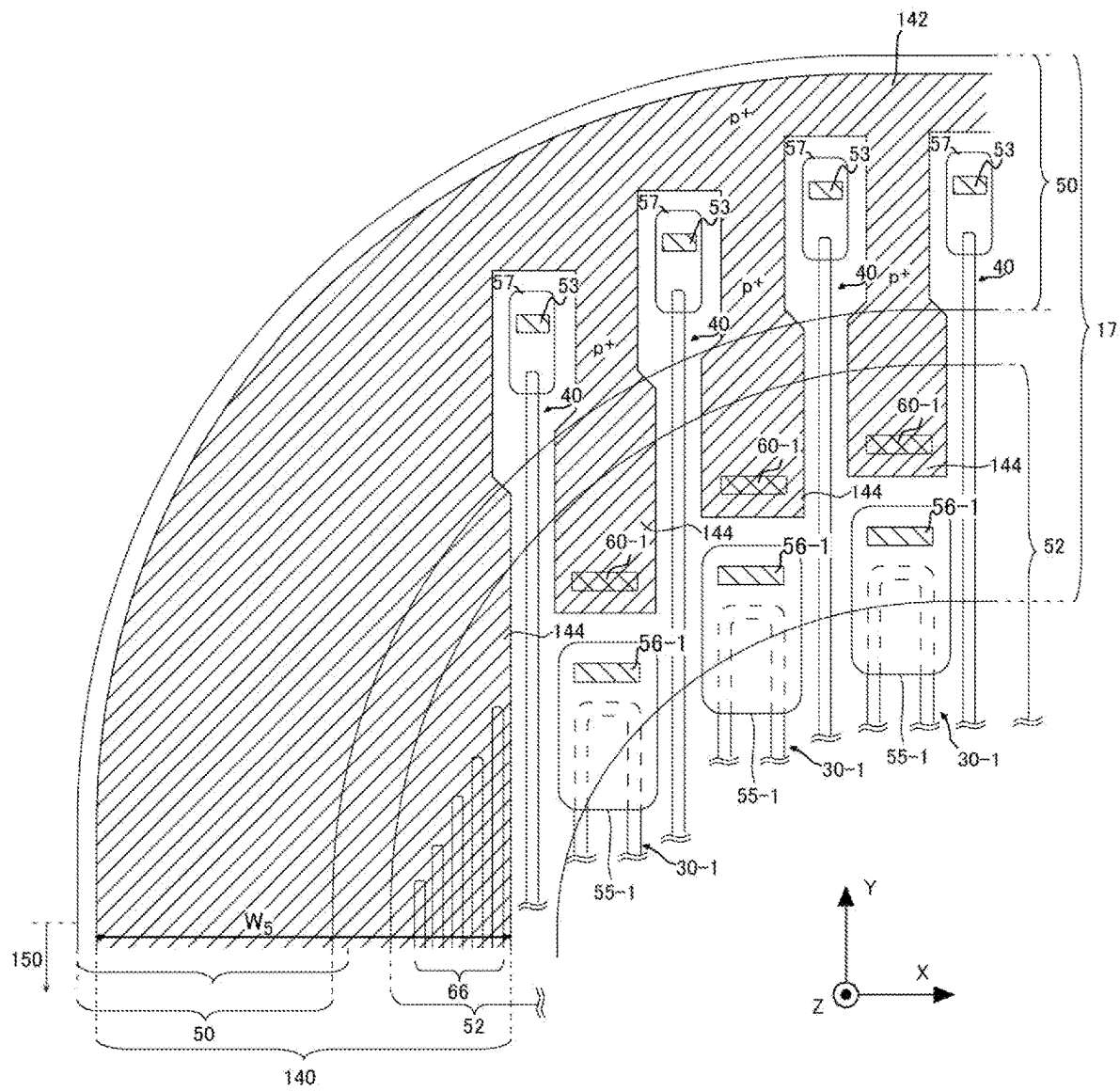
FIG. 19 is an overhead view of a region near a corner portion of the semiconductor substrate 10.

FIG. 19 is an overhead view of a region near a corner portion of the semiconductor substrate 10. In this region, the gate metal layer 50 is provided with a curved belt shape such as an arc. In this region, each gate connection portion 57, runner contact portion 53, first contact portion 60-1, and extending portion 144 is arranged such that the position thereof on the Y-axis changes sequentially along the curve of the gate metal layer 50. Each extending portion 144 is arranged extending from a corresponding first contact portion 60-1 to below the gate metal layer 50. Furthermore, the outer connecting portion 142 is provided with a belt shape curving along the gate metal layer 50.

With such a configuration, the high concentration region 140 can be arranged surrounding the active region 100 in the overhead view. Furthermore, in the region 150 where the gate metal layer 50 extends in the Y-axis direction in a straight line, the high concentration region 140 may have a uniform width $W_5$ in the X-axis direction.

Figure 20:
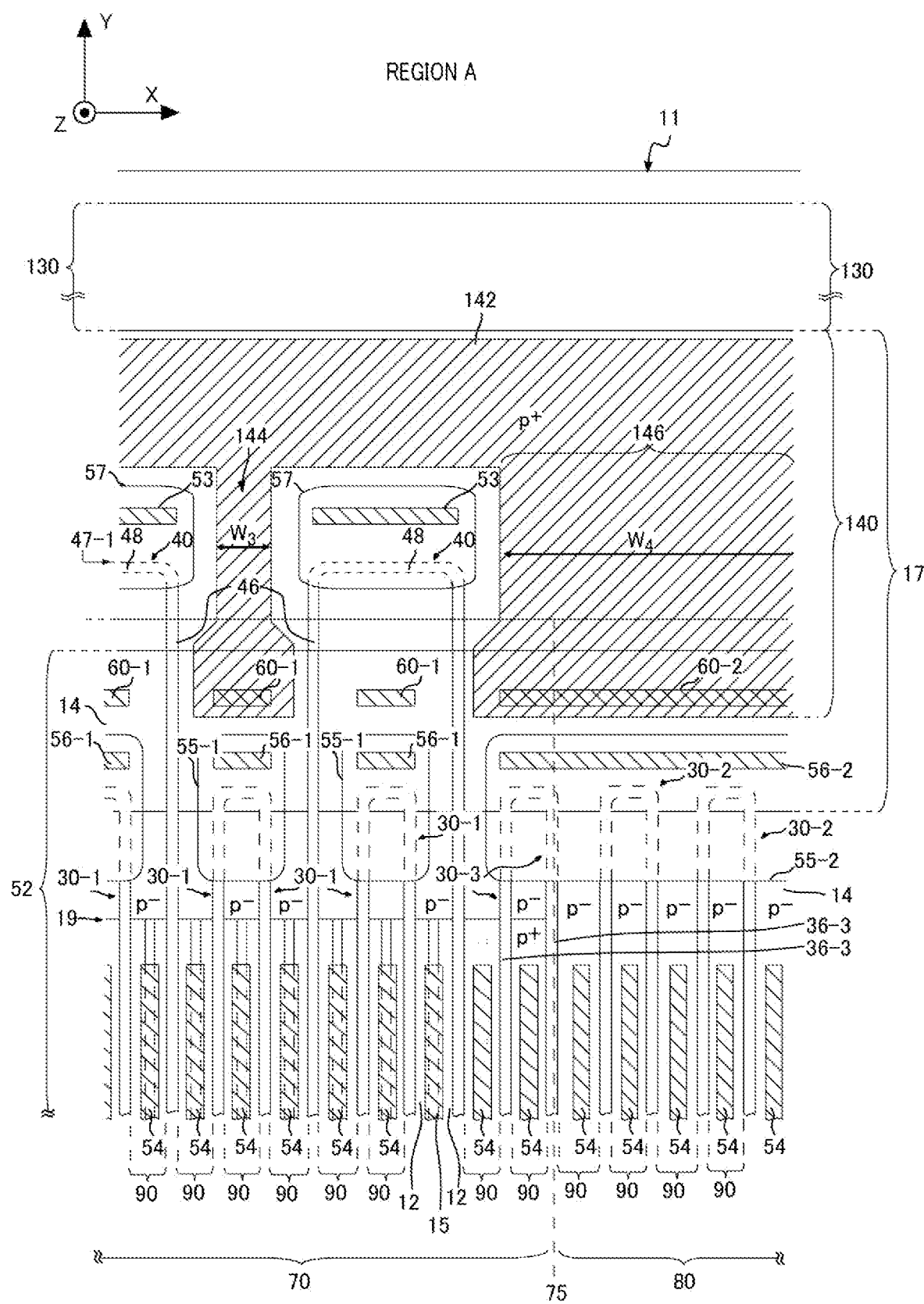
FIG. 20 shows another example of the region A.

FIG. 20 shows another example of the region A. Each gate trench portion 40 of the present example includes long portions 46 and a short portion 48, in the same manner as in FIG. 2. However, the IGBT region 70 of the present embodiment includes gate connection portions 57 instead of the gate runners 51 shown in FIG. 2. A gate connection portion 57 is provided for each short portion 48. The plurality of gate connection portions 57 are arranged distanced from each other.

The semiconductor device 200 includes the high concentration region 140 described in FIGS. 14 to 19. However, the high concentration region 140 of the present example passes between the two short portions 48 of each gate trench portion 40 and extends from below the first contact portions 60-1 to positions farther outward than the short portions 48.

The contact region 15 shown in FIG. 4 may be provided to each first contact portion 60-1 surrounded by two long portions 46 and a short portion 48. This contact region 15 may be provided in a range not overlapping with the gate metal layer 50. In another example, this contact region 15 may be provided in a range overlapping with the gate metal layer 50. In this case, the contact region 15 is provided extending in the Y-axis direction from below the first contact portions 60-1 to below the gate metal layer 50. It should be noted that the contact region 15 is provided farther inward than the short portions 48. The configurations of the gate trench portions 40 and the high concentration region 140 described in FIG. 20 may be applied to any of the aspects described in FIGS. 14 to 19.

Furthermore, in the FWD region 80, the high concentration region 140 is provided to the second contact portion 60-2. The high concentration region 140 includes an extending portion 146 extending from the second contact portion 60-2 to below the gate metal layer 50. The extending portion 146 of the present example is connected to the outer connecting portion 142. In the Y-axis direction, the width $W_4$ of the extending portion 146 of the FWD region 80 may be greater than the width $W_3$ of the extending portion 144 of the IGBT region 70.

In this way, the extending portion 146 can be provided overlapping with the entire second contact portion 60-2. The extending portion 146 may be provided across the entire FWD region 80 in the Y-axis direction. The configuration of the extending portion 146 of the present example may be applied to any of the aspects described in FIGS. 14 to 19.

Figure 21:
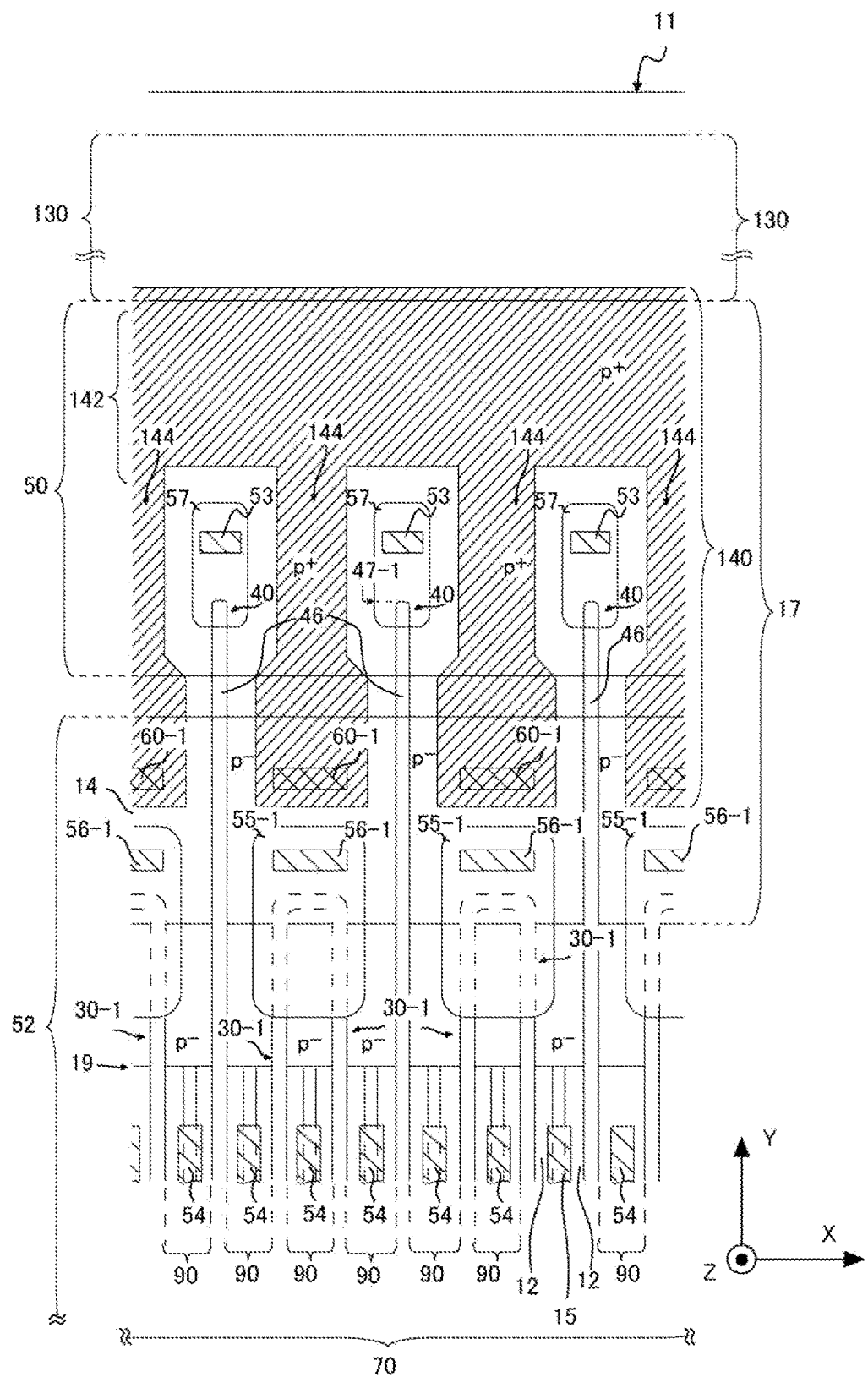
FIG. 21 is an overhead view of another example of the high concentration region 140.

FIG. 21 is an overhead view of another example of the high concentration region 140. The high concentration region 140 of the present example is provided extending in the Y-axis direction farther outward than the gate metal layer 50. In this way, the holes flowing from the outside of the gate metal layer 50 to the active region 100 can be more efficiently extracted. The high concentration region 140 may also be provided extending in the X-axis direction farther outward than the gate metal layer 50.

The high concentration region 140 described in FIGS. 14 to 21 may be applied to any of the aspects described in FIGS. 1 to 13.

A tungsten plug may be provided inside each peripheral contact portion 60 and peripheral longitudinal contact portion 66. The emitter electrode 52 may be connected to the top surface 92 of the semiconductor substrate 10 via these tungsten plugs.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: semiconductor substrate, 11: end portion, 12: emitter region, 13: floor portion, 14: base region, 15: contact region, 17: well region, 18: drift region, 19: termination portion, 20: buffer region, 22: collector region, 24: collector electrode, 26: interlayer insulating film, 28: oxide film, 30: dummy trench, 32: dummy trench insulating film, 33: dummy conducting portion, 34: dummy trench, 35: floor portion, 36: long portion, 37: end portion, 38: short portion, 40: gate trench portion, 42: gate insulating film, 43: gate conducting portion, 44: gate trench, 45: charge accumulation region, 46: long portion, 47: end portion, 48: short portion, 50: gate metal layer, 51: gate runner, 52: emitter electrode, 53: runner contact portion, 54: mesa contact portion, 55: connection layer, 56: connection layer contact portion, 57: gate connection portion, 60: peripheral contact portion, 61: first end portion, 62: main region, 63: second end portion, 64: sub region, 66: peripheral longitudinal contact portion, 70: IGBT region, 75: border, 80: FWD region, 82: cathode region, 90: mesa portion, 92: top surface, 94: bottom surface, 100: active region, 110: gate runner portion, 120: gate pad region, 130: edge termination region, 140: high concentration region, 142: outer connecting portion, 144: extending portion, 146: extending portion, 150: region, 200: semiconductor device

What is claimed is:

1. A semiconductor device comprising:
a top surface electrode that is provided above a top surface of a semiconductor substrate and is formed by material including metal;
a first trench portion that is provided in an active region and includes a first conductive portion that is electrically connected to the top surface electrode;
a semiconductor region with a first conductivity type that is provided in at least a part of a region between an end portion of a long portion of the first trench portion and an end portion of the semiconductor substrate; and
a contact portion that electrically connects the semiconductor region and the top surface electrode,
wherein a width of the contact portion in a second direction that is substantially orthogonal to a first direction in which the long portion extends, is greater than a width of the first trench portion in the second direction.

2. The semiconductor device according to claim 1, further comprising:
a gate metal layer that is provided above the top surface of the semiconductor substrate; and
a second trench portion that is provided in the active region of the semiconductor substrate and includes a second conductive portion that is electrically connected to the gate metal layer.

3. The semiconductor device according to claim 2, further comprising:
a base region with the first conductivity type that is provided in the active region of the semiconductor substrate and is configured to function as a channel formation region near the second trench portion;
wherein the semiconductor region is a high concentration region with a higher doping concentration than the base region.

4. The semiconductor device according to claim 3, further comprising:
a connection layer that is a polysilicon layer that is electrically connected to the first conductive first conductive portion.

5. The semiconductor device according to claim 4, further comprising:
a mesa portion that is a portion of the semiconductor substrate positioned between two adjacent the first trench portions,
wherein a width of the contact portion is greater than a width of the mesa portion, in the second direction.

6. The semiconductor device according to claim 4, wherein
the connection layer includes a connection layer contact portion that is electrically connected to the top surface electrode, and
the contact portion is provided between the connection layer contact portion and an end portion of the top surface electrode, in the first direction.

7. The semiconductor device according to claim 5, wherein
the contact portion extends in the second direction along the connection layer.

8. The semiconductor device according to claim 3, wherein
the active region is, in an overhead view, a region inside an range in which the top surface electrode is provided.

9. The semiconductor device according to claim 8, wherein
the contact portion is provided is provided between the end portion of the long portion of the first trench portion and an end portion of the semiconductor substrate.

10. The semiconductor device according to claim 5, further comprising:
a drift region with the first conductivity type, at least a part of which is provided within the mesa portion; and
a first bottom surface region that is provided at least along an outer periphery of a bottom surface of the semiconductor substrate and having a higher doping concentration than the drift region,
wherein the first bottom surface region functions as a cathode of a diode.

11. The semiconductor device according to claim 10, wherein,
the semiconductor region is in contact with the base region, and
the base region functions as an anode of the diode.

12. The semiconductor device according to claim 10, further comprising:
a second bottom surface region with the first conductivity type that is provided discretely inside the first bottom surface region and includes a higher doping concentration than the base region,
on the bottom surface of the semiconductor substrate.

13. The semiconductor device according to claim 4, further comprising:
an edge termination region that includes a structure formed by one or more of a combination of a guard ring, a filed plate and a RESURF,
wherein the semiconductor region is provided in the edge termination region.

14. The semiconductor device according to claim 4, further comprising:
a well region with the first conductivity type, including a floor surface at a position that is deeper than a floor portion of the first trench portion,
wherein the semiconductor region is positioned above the well region.

15. The semiconductor device according to claim 14, wherein,
the well region surrounds the end portion of the long portion of the first trench portion.

16. The semiconductor device according to claim 14, further comprising:
an intermediate region with a second conductivity between the semiconductor region and the well region, below the contact portion,
wherein the intermediate region has a lower doping concentration than the semiconductor region and the well region.

17. The semiconductor device according to claim 16, wherein,
the intermediate region is the base region.

18. The semiconductor device according to claim 2, further comprising:
one or more peripheral longitudinal contact portions that are positioned farther outward than the first trench portion or the second trench portion positioned farthest outward in the second direction, and extend in the first direction.

19. A semiconductor device comprising: a top surface electrode that is provided above a top surface of a semiconductor substrate and is formed by material including metal; a first trench portion that is provided in an active region and includes a first conductive portion that is electrically connected to the top surface electrode; a semiconductor region with a first conductivity type that is provided in at least a part of a region between an end portion of a long portion of the first trench portion and an end portion of the semiconductor substrate; a contact portion that electrically connects the semiconductor region and the top surface electrode; and a connection layer that is a polysilicon layer that is electrically connected to the first conductive portion, wherein the contact portion extends along the connection layer in a second direction that is substantially orthogonal to a first direction in which the long portion extends.

* * * * *